US008083415B2

(12) United States Patent
Moore et al.

(10) Patent No.: US 8,083,415 B2
(45) Date of Patent: Dec. 27, 2011

(54) LINE-SIDE OUT-OF-BAND ELECTRICAL INTERFACE FOR OPTOELECTRONIC MODULES

(75) Inventors: Joshua Moore, Sunnyvale, CA (US); Greta Light, San Mateo, CA (US)

(73) Assignee: Finisar Corporation, Sunnyvale, CA (US)

( * ) Notice: Subject to any disclaimer, the term of this patent is extended or adjusted under 35 U.S.C. 154(b) by 76 days.

(21) Appl. No.: 12/181,484

(22) Filed: Jul. 29, 2008

(65) Prior Publication Data

US 2009/0148106 A1 Jun. 11, 2009

Related U.S. Application Data

(60) Provisional application No. 61/012,007, filed on Dec. 6, 2007.

(51) Int. Cl.
*G02B 6/38* (2006.01)
(52) U.S. Cl. ........................................................ 385/75
(58) Field of Classification Search ...................... 385/75
See application file for complete search history.

(56) References Cited

U.S. PATENT DOCUMENTS

| 5,966,487 | A * | 10/1999 | Gilliland et al. | 385/92 |
| 6,890,206 | B2 * | 5/2005 | Distad et al. | 439/372 |
| 7,097,468 | B2 * | 8/2006 | Ice | 439/79 |
| 2006/0045409 | A1 * | 3/2006 | Tatum et al. | 385/12 |
| 2006/0128221 | A1 * | 6/2006 | Yoshikawa et al. | 439/607 |
| 2007/0237471 | A1 * | 10/2007 | Aronson et al. | 385/101 |

* cited by examiner

*Primary Examiner* — Uyen Chau N Le
*Assistant Examiner* — Hoang Tran
(74) *Attorney, Agent, or Firm* — Maschoff Gilmore & Israelsen

(57) ABSTRACT

Electrical connections from the printed circuit board ("PCB") of an optoelectronic device through the front or line-side of the device enable a microcontroller or other component on the PCB to electrically communicate with an optical connector or other line-side device. The electrical connections can be integrated within a lead frame and trace structure providing mechanical support for the electrical connections and the PCB, with each electrical connection including a PCB-side contact and a line-side contact supported by the integrated structure. Alternately, the electrical connections can be integrated within one or more flex circuits. The optical connector can include traces and contacts configured to be electrically coupled to corresponding line-side contacts when the optical connector is received within the device.

17 Claims, 21 Drawing Sheets

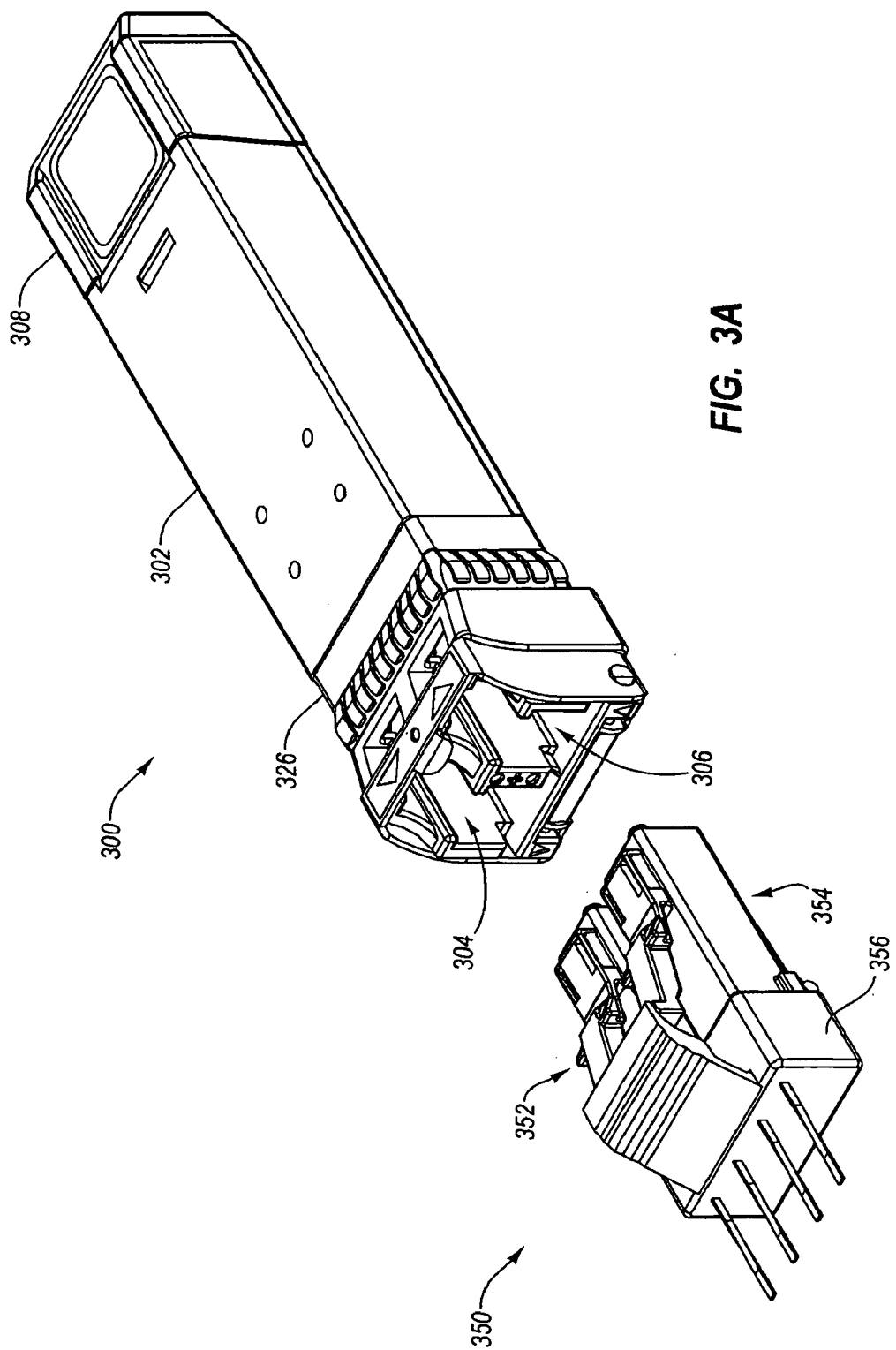

LINE-SIDE OUT-OF-BAND ELECTRICAL INTERFACE FOR OPTOELECTRONIC MODULES

CROSS-REFERENCE TO RELATED APPLICATIONS

The present application claims the benefit of and priority to U.S. Provisional Application Ser. No. 61/012,007, entitled "LINE-SIDE OUT-OF-BAND DIGITAL DIAGNOSTICS TRANSMISSION," filed Dec. 6, 2007, which application is fully incorporated herein by reference in its entirety.

BACKGROUND OF THE INVENTION

1. The Field of the Invention

Embodiments of the invention relate to methods, systems, and devices for out-of-band communication with optoelectronic modules. More particularly, embodiments of the invention relate to line-side out-of-band electrical interfaces for optoelectronic modules.

2. The Relevant Technology

Computing, telecom and networking technology have transformed our world. As the amount of information communicated over networks has increased, high speed transmission has become ever more critical. Many high speed data transmission networks rely on optoelectronic modules, including optoelectronic transceivers and transponders, for facilitating transmission and reception of digital data embodied in the form of optical signals over optical fibers. Optical networks are thus found in a wide variety of high speed applications ranging from modest Local Area Networks ("LANs") to backbones that define a large portion of the infrastructure of the Internet.

FIG. 1 illustrates a conventional system 100 for implementing an optical network connection in such networks. Typically, data transmission and reception is implemented by way of an optoelectronic device or module 110 that includes an optical transmitter 114 for data transmission and an optical receiver 112 for data reception. The optical transmitter 114 and optical receiver 112 can be operably coupled to optical fibers 120A, 120B via optical connector 130. Many optoelectronic devices additionally include a microcontroller 116 or other means configured to perform digital diagnostic functions. Digital diagnostic data can then be used by the microcontroller to optimize the performance of the device 110. In addition, certain multi-source agreement ("MSA") standards require that optoelectronic devices track and report various digital diagnostic parameters to the host systems in which they are used.

For instance, MSA standards may require that the optoelectronic module measure and report the temperature of the unit, the voltage received from the host, the laser bias current, the optical transmit power, and the optical receive power. Other digital diagnostic parameters not required for compliance with an MSA may nevertheless be useful in optimizing the performance of the module and/or diagnosing problems. For instance, modulation current can be used in end-of-life calculations for the unit. Alternately or additionally, slope efficiency can be used internally by the unit to keep the transmitter at a true optimal point for a given temperature.

In the conventional system 100 depicted in FIG. 1, the digital diagnostic data is communicated out-of-band ("OOB") to a host 140 over a host interface 142 using a protocol such as I²C or the like. The host reads the diagnostic information and provides this information to other attached network resources. In some circumstances, however, it may be difficult or inconvenient to implement the interface with the host in order to read the diagnostic data and provide it to the other network resources. For instance, a host may not be equipped to receive a host interface. Alternately or additionally, it may be desirable to transmit the digital diagnostic data directly to the appropriate network resource without sending it through the host.

In addition to being able to retrieve information, such as digital diagnostics, from optoelectronic modules, it may also be desirable to provide the optoelectronic modules with information such as programming commands and memory codes over an OOB interface. While such information may be transmitted OOB through a host interface to a module—similar to the way digital diagnostics may be transmitted through the host interface to the host—this solutions suffers from some of the same disadvantages already mentioned, e.g., it may be difficult or inconvenient and/or the host may not be equipped with such an interface.

Consequently, what are needed are improved methods and systems for communicating out-of-band with optoelectronic modules.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF THE INVENTION

These and other limitations are overcome by embodiments of the invention which relate to systems and methods for electrically communicating out-of-band through the front or line-side (e.g., the optical side) of an optoelectronic device such as a transceiver or transponder. Embodiments of the invention include printed circuit board ("PCB") to line-side electrical connections, optoelectronic devices with PCB to line-side electrical connections, optical connectors with integrated electrical connections for communicating out-of-band with optoelectronic devices, and the like. Advantageously, embodiments of the invention facilitate line-side out-of-band ("OOB") electrical communication with optoelectronic devices, simplify optoelectronic device assembly, save space within optoelectronic devices, and minimize electromagnetic interference ("EMI") emissions from the optoelectronic devices.

In one embodiment of the invention, an out-of-band line-side electrical interface is configured to electrically connect a printed circuit board (PCB) of an optoelectronic device to an optical connector removably received within an optical port of the optoelectronic device. The electrical interface includes a lead frame body with a plurality of line-side posts and a plurality of PCB-side posts, and a plurality of traces embedded within the lead frame body, each trace including a line-side contact embedded within a line-side post and a PCB-side contact embedded within a PCB-side post. Each of the line-side contacts is configured to be electrically coupled to a contact of an optical connector that has been received within an optical port of a corresponding optoelectronic device and each of the PCB-side contacts is configured to be electrically coupled to a contact on the PCB.

In another embodiment of the invention, an optoelectronic device includes a microcontroller electrically coupled to a PCB. The optoelectronic device may additionally include an optical port configured to removably receive an optical connector with integrated contacts, a lead frame body having a plurality of line-side posts and a plurality of PCB-side posts, and electrical connections from the PCB to the optical port. The optical connector is configured to optically couple an optical transmitter or optical receiver of the optoelectronic device to an optical medium. The electrical connections are configured to be electrically coupled to the integrated electrical contacts of the optical connector. The electrical connections enable electrical communication between the microcontroller on the PCB and the optical connector. The electrical connections are embedded within the lead frame body. Each of the electrical connections includes a line-side contact and a PCB-side contact. Each of the line-side contacts is embedded within a corresponding one of the line-side posts and is configured to be in direct contact with and electrically coupled to a corresponding one of the integrated contacts on the optical connector when received within the optical port. Each of the PCB-side contacts is embedded within a corresponding one of the PCB-side posts and is configured to be in direct contact with and electrically coupled to a corresponding contact on the printed circuit board.

In another embodiment of the invention, an optical connector is configured to electrically communicate with a microcontroller on a PCB of an optoelectronic device via lineside electrical connections. The optical connector includes a release latch configured to engage a slot when inserted into an optical port of an optoelectronic device, a release latch base supporting the release latch, and embedded electrical traces each including a contact. The electrical traces are configured to be in direct contact with and electrically coupled to corresponding contacts within the optical port that provide electrical connections to a microcontroller disposed on the PCB of the optoelectronic device. The electrical connections are embedded within a lead frame body having line-side posts and PCB-side posts. Each of the electrical connections includes a line-side contact and a PCB-side contact. Each of the line-side contacts is embedded within a corresponding one of the line-side posts and is configured to be in direct contact with and electrically coupled to a corresponding one of the electrical contacts on the optical connector when received within the optical port. Each of the PCB-side contacts is embedded within a corresponding one of the PCB-side posts and is configured to be in direct contact with and electrically coupled to a corresponding contact on the printed circuit board.

Additional features of the invention will be set forth in the description which follows, and in part will be obvious from the description, or may be learned by the practice of the invention. The features of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 3A-3C depict different views of an optoelectronic transceiver module and optical connector according to embodiments of the invention;

DETAILED DESCRIPTION

Figure 1:
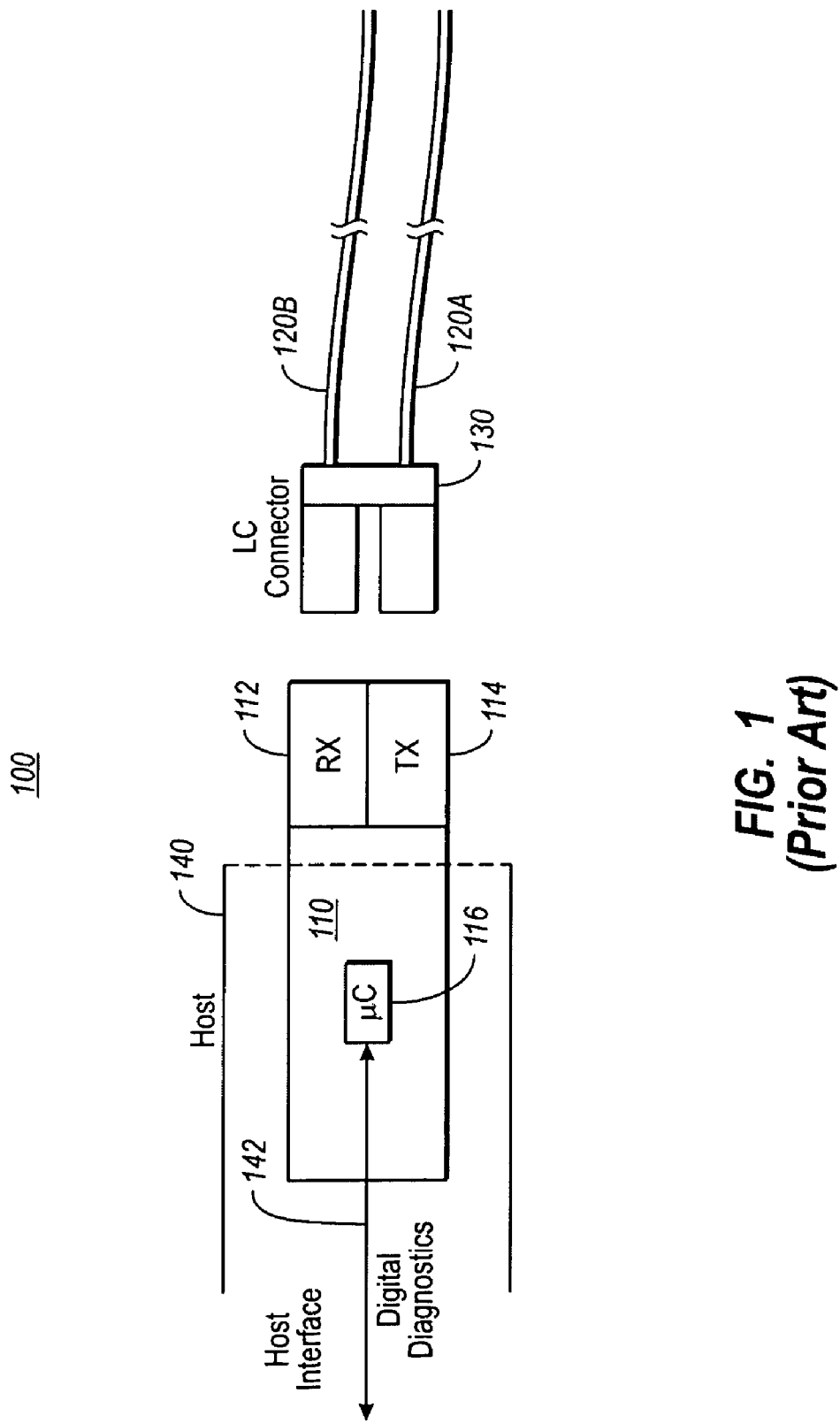
FIG. 1 illustrates prior art digital diagnostic data and other electrical communication via an OOB host interface.

Embodiments of the invention relate to systems and methods for electrically communicating out-of-band through the front or line-side (e.g., the optical side) of an optoelectronic device such as a transceiver or transponder. Embodiments of the invention include printed circuit board ("PCB") to line-side electrical connections, optoelectronic devices with PCB to line-side electrical connections, optical connectors with integrated electrical connections for communicating out-of-band with optoelectronic devices, and the like. Embodiments of the invention can facilitate line-side out-of-band ("OOB") electrical communication with optoelectronic devices, simplify optoelectronic device assembly, save space within optoelectronic devices, and/or minimize electromagnetic interference ("EMI") emissions from the optoelectronic devices.

Example embodiments of the invention relate to contacts for line-side OOB electrical communication that can be implemented in optoelectronic devices and/or to contacts that can be implemented in connectors, such as fiber optic connectors, configured to couple optoelectronic devices to optical fibers. Some optoelectronic devices with line-side OOB contacts can be configured to be connected to connectors with or without corresponding contacts. Similarly, some connectors with corresponding contacts can be configured to be connected to optoelectronic devices with or without line-side OOB contacts. Embodiments of the invention can enable optoelectronic devices to electrically communicate out-of-band at their optical ports rather than over a host interface. Alternately or additionally, embodiments of the invention may facilitate force balancing on an optical connector to eliminate biasing of a corresponding optical fiber.

The present invention can be implemented in various optoelectronic devices. As used herein, the term "optoelectronic device" includes devices having both optical and electrical components. Examples of optoelectronic devices include, but are not limited to transponders, transceivers, transmitters, and/or receivers. Optoelectronic devices can be used, for instance, in telecommunications networks, local area networks, metro area networks, storage area networks, wide area networks, and the like.

Optoelectronic devices according to embodiments of the invention can be configured for optical signal transmission and reception at a variety of per-second data rates including, but not limited to, 1 Gbit, 2 Gbit, 2.5 Gbit, 4 Gbit, 8 Gbit, 10 Gbit, or higher. Furthermore, the optoelectronic devices can be configured for optical signal transmission and reception at various wavelengths including, but not limited to 850 nm, 1310 nm, 1470 nm, 1490 nm, 1510 nm, 1530 nm, 1550 nm, 1570 nm, 1590 nm, or 1610 nm. Further, the optoelectronic devices can be configured to support various transmission standards including, but not limited to, Fast Ethernet, Gigabit Ethernet, 10 Gigabit Ethernet, and 1×, 2×, 4×, and 10× Fibre Channel. In addition, although one example embodiment of an optoelectronic device is configured to have a form factor that is substantially compliant with the SFP+ (IPF) MSA, optoelectronic devices according to the invention can alternatively be configured to have a variety of different form factors that are substantially compliant with other MSAs including, but not limited to, the SFP MSA, X2 MSA, Xenpak MSA, SFF MSA or the SFP MSA.

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

Figure 2:
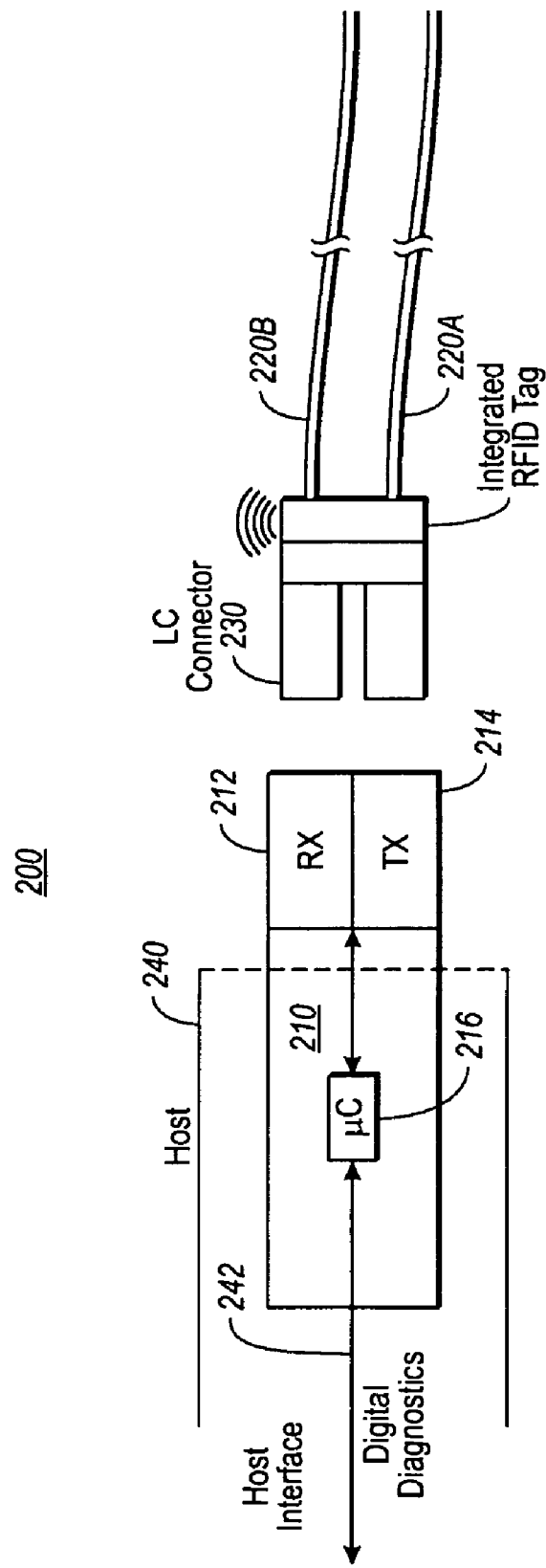
FIG. 2 schematically illustrates one embodiment of a line-side out-of-band electrical interface.

FIG. 2 schematically illustrates an example operating environment 200 in which embodiments of the invention can be practiced. The environment 200 includes an optoelectronic transceiver (or transponder) module 210, optical media 220A and 220B, optical connector 230, and a host 240. The transceiver 210 includes an optical transmitter 214 configured to emit optical data signals representative of electrical data signals received from the host 240 into an optical medium 220A, which may comprise a fiber optic cable. An optical receiver 212 is configured to receive optical data signals from the optical medium 220B and convert them to electrical data signals which are provided to the host 240.

The transceiver 210 additionally includes a microcontroller or other control module 216 configured to measure and report one or more digital diagnostic parameters of the transceiver 210. The digital diagnostic parameters measured by the microcontroller 216 may include one or more of: the temperature of the transceiver 210, the voltage received from the host, the transmitter bias current used to operate the transmitter 214, the optical transmit power of signals emitted by the transmitter 214, the optical receive power of signals received at the receiver 212, modulation current of the optical transmitter 214, slope efficiency of the transmitter 214, and the like or any combination thereof. Alternately or additionally, the microcontroller 216 may be configured to receive and/or execute programming commands and/or memory codes received via a line-side OOB electrical interface. Alternately or additionally, the microcontroller 216 may be configured to provide electrical power via a line-side OOB electrical interface to a line-side device.

Although not required, the microcontroller may additionally be configured to communicate with the host 240 over a host interface 242. Where implemented, the host interface 242 may communicate via a protocol such as I²C, MDIO, SPI, 1-wire, and the like or any combination thereof.

Figure 3B:
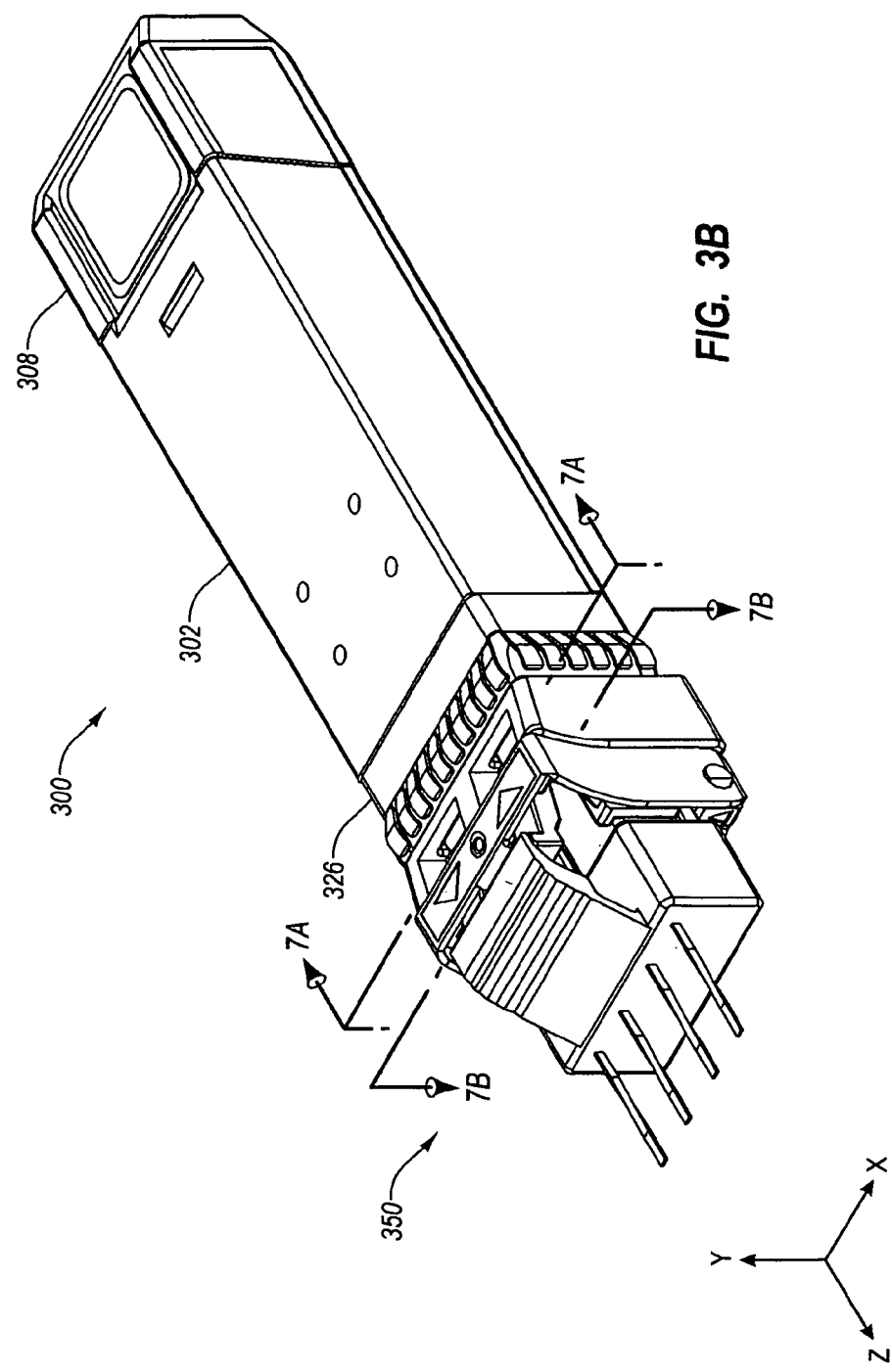
Figure 3C:
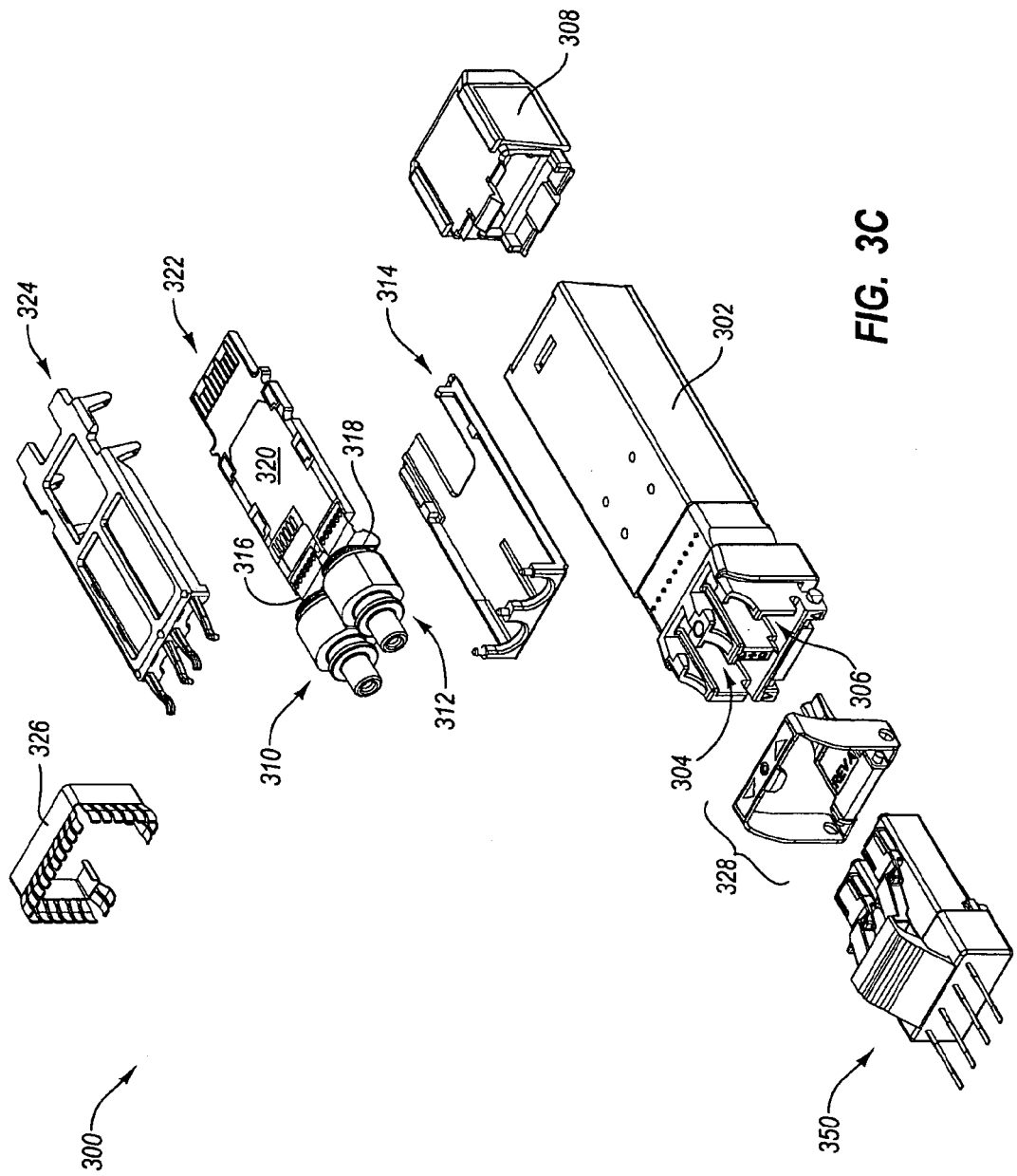

As shown, the microcontroller is configured to electrically communicate with a line-side device, such as an LC connector 230 with integrated contacts and RFID tag, via a line-side electrical interface, aspects of which are illustrated in greater detail in FIGS. 3A-3C. The line-side electrical interface allows the transceiver module 210 to present digital diagnostic data to a line-side device rather than the host 240, to receive information such as programming commands and memory codes from a line-side device rather than the host 240, and to provide electrical power to line-side devices outside of the host such as connector LEDs, motors, or the like. In some embodiments, the OOB line-side electrical interface thus enables wireless or other transmission of data between the transceiver module 210 and one or more external network resources via a line-side device 230 coupled to the OOB line-side electrical interface.

With additional reference to FIGS. 3A-3C, mechanical aspects of an example optoelectronic transceiver module 300 and fiber optic connector 350 are illustrated that are configured to electrically communicate through an OOB line-side electrical interface. The transceiver module 300 and connector 350 may correspond to the transceiver module 210 and connector 230 of FIG. 2, respectively. As illustrated in FIG. 3A, the optoelectronic transceiver module 300 includes various components, including a shell 302, an output port 304 and input port 306 defined in the shell 302, and a host-side end cap 308. The shell 302 can be formed using a die casting process from zinc and/or other suitable materials. While the shell 302 is illustrated as a single component, alternately or additionally the shell 302 may comprise multiple components, such as a top shell and a bottom shell, sheet metal enclosure, or the like or any combination thereof.

FIG. 3C further illustrates that the transceiver module 300 additionally includes a transmitter optical subassembly ("TOSA") 310 configured to emit optical data signals through the output port 304, and a receiver optical subassembly ("ROSA") 312 configured to receive optical data signals through the input port 306. The TOSA 310 and ROSA 312 may correspond, respectively, to the transmitter 214 and receiver 212 of FIG. 2.

Turning back to FIG. 3A, the fiber optic connector 350 is a dual fiber connector that includes a transmit LC connector 352, a receive LC connector 354, and a connector removal mechanism 356. The fiber optic connector 350 is configured to terminate the ends of two optical fibers (not shown), mechanically coupling and aligning the cores of the optical fibers with the TOSA 310 and the ROSA 312. In particular, the transmit LC connector 352 aligns one of the optical fibers with the TOSA 310 and the receive LC connector 354 aligns the other optical fiber with the ROSA 312. As such, each of the transmit LC connector 352 and the receive LC connector 354 is configured to be removably received within the output port 304 and the input port 306, respectively, of the transceiver module 300.

FIG. 3A illustrates the connector 350 removed from the transceiver module 300 while FIG. 3B illustrates the connector 350 in an insertion position within the transceiver module 300. FIG. 3C illustrates an exploded view of the transceiver 300 and connector 350. In the embodiment of FIGS. 3A-3C, the connector 350 is illustrated as a duplex fiber connector that includes two LC connectors. Alternately or additionally, embodiments of the invention can be implemented with one or more other fiber connectors, including one or more LC, SC, or FC style connectors, or the like or any combination thereof.

As further illustrated in FIG. 3C, the example optoelectronic transceiver module 300 also includes positioning structure 314, electrical interfaces 316, 318, printed circuit board ("PCB") 320 having an edge connector 322, integrated lead frame and trace structure 324, EMI collar clip 326, and latching mechanism 328. The two electrical interfaces are used to electrically connect the TOSA 310 and the ROSA 312, respectively, to the PCB 320. The positioning structure 314, integrated lead frame and trace structure 324, and end cap 308 mechanically support the PCB 320, TOSA 310, ROSA 312, and flexible circuits 316, 318 within the shell 302. The PCB 320 may include various electrical components (not shown), such as a laser driver, post amplifier, and microcontroller.

The integrated lead frame and trace structure 324 can enable electrical communication between the microcontroller or other component on the PCB 320 and a line-side device, such as the connector 350, and may be generically referred to as an OOB line-side electrical interface. To this end, the integrated lead frame and trace structure 324 includes a plurality of PCB-side contacts configured to be electrically and/or mechanically coupled to corresponding contacts on the PCB 320, and a plurality of line-side contacts configured to be electrically and/or mechanically coupled to corresponding contacts on the connector 350. As a result, digital diagnostic data or power can be provided from the microcontroller (or other PCB component) to the connector 350 or other line-side device, and power commands, memory codes, and other information can be provided from the connector 350 or other line-side device to the microcontroller (or other PCB component). Alternately or additionally, the transceiver module 300 may include one or more separate wires, flexible circuits, or the like, rather than the integrated structure 324, for providing a line-side electrical interface, an example embodiment of which is described below with respect to FIGS. 8-12.

Figure 4A:
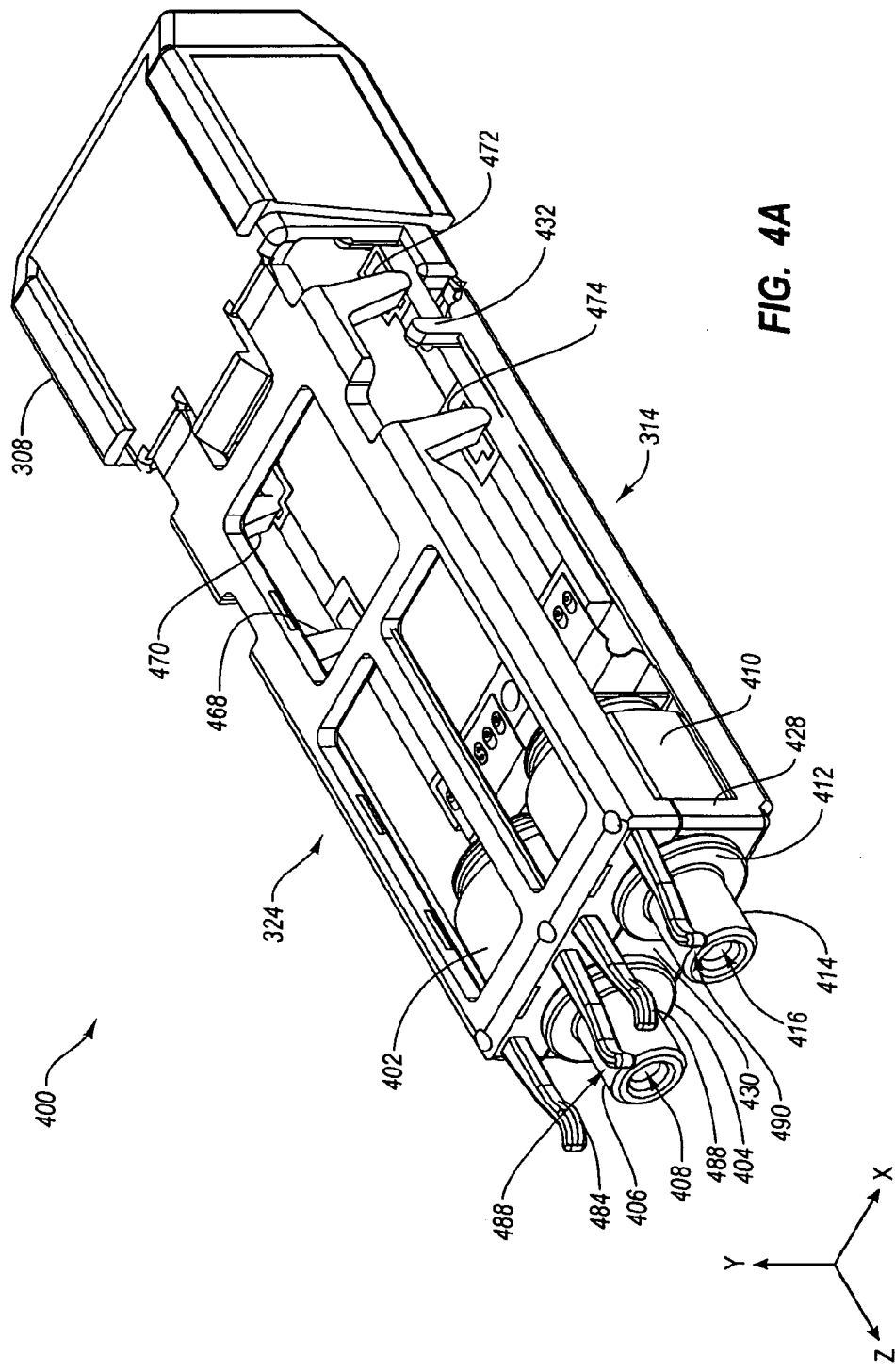
FIGS. 4A-4C illustrate mechanical support provided by an integrated lead frame and trace structure, positioning structure, and end cap that can be implemented in the optoelectronic transceiver module of FIGS. 3A-3C.
Figure 4B:
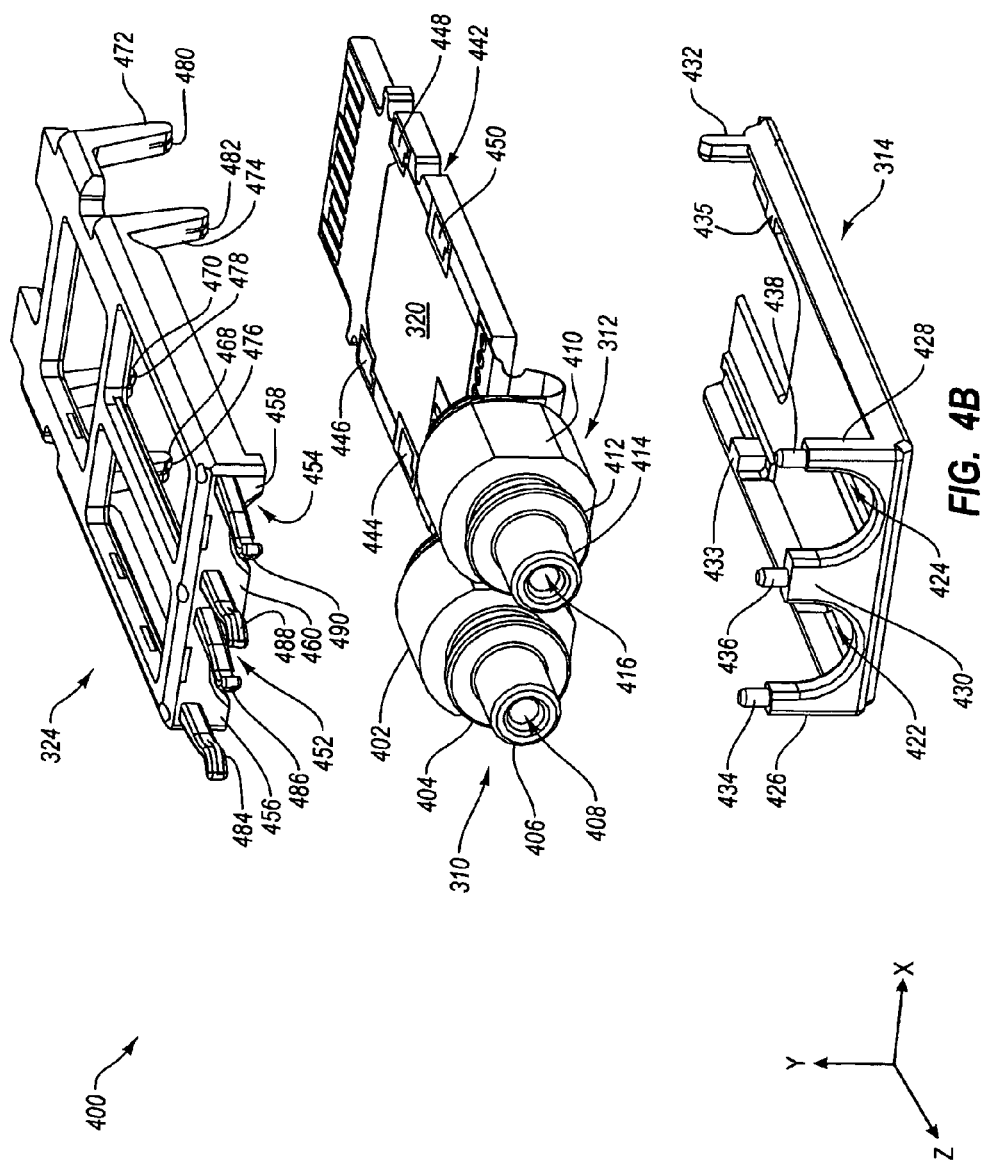
Figure 4C:
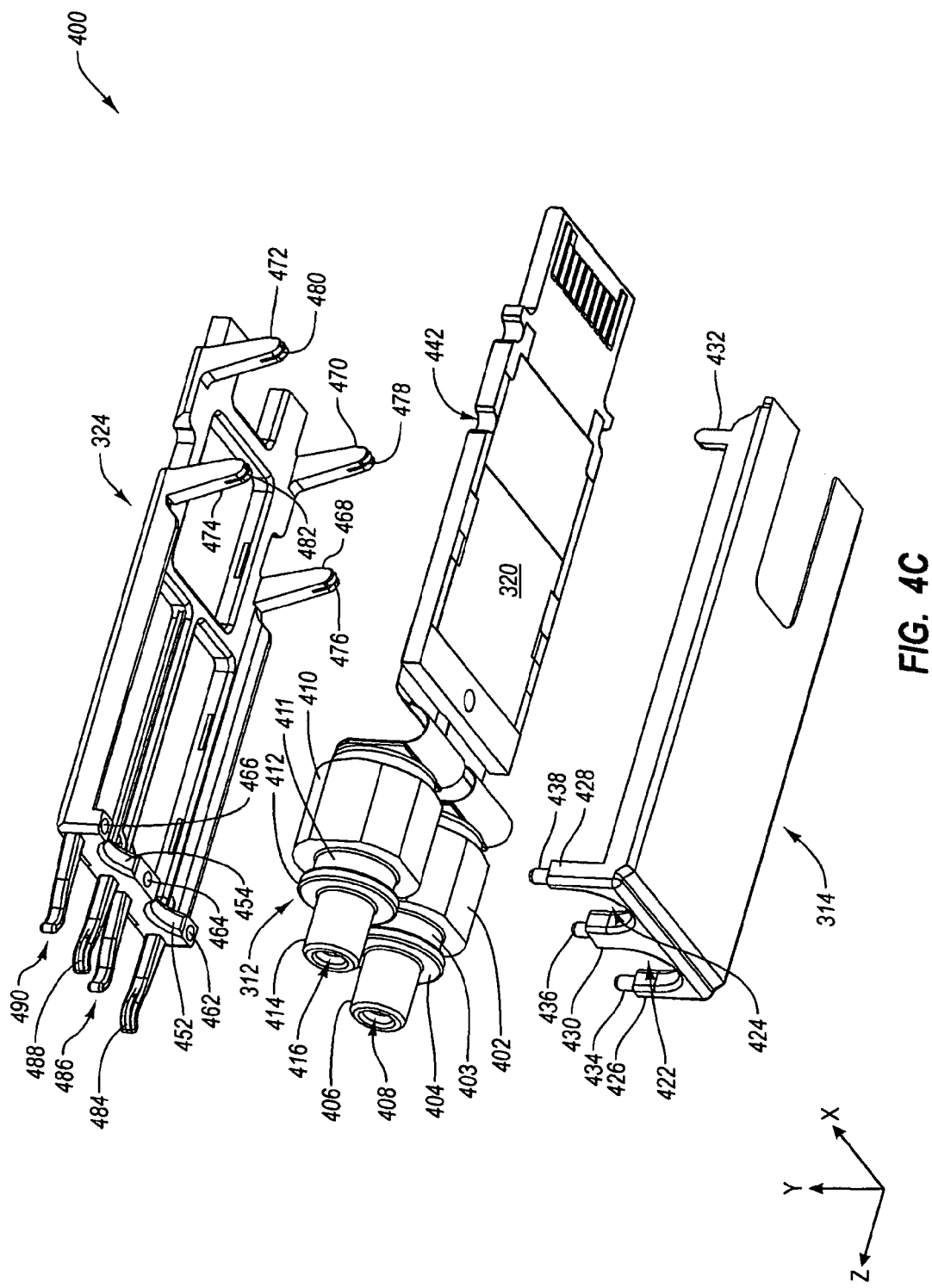

With reference now to FIGS. 4A-4C together, aspects of the TOSA 310, ROSA 312, positioning structure 314, PCB 320, integrated lead frame and trace structure 324, and end cap 308 are illustrated in greater detail. The TOSA 310 includes a barrel 402 within which an optical transmitter, such as a laser (not shown), is disposed. The TOSA 310 additionally includes a neck 403, a flange 404, and a nose piece 406. The nose piece 406 defines a port 408. The port 408 is configured to optically connect the optical transmitter disposed within the barrel 402 with a fiber-ferrule (not shown) disposed within the output port 304 when the transceiver module 300 is connected to the fiber optic connector 350 (see FIGS. 3A and 3B).

Similarly, the ROSA 312 includes a barrel 410, a neck 411, a flange 412, and a nose piece 414. The nose piece 414 defines a port 416. The port 416 is configured to optically connect an optical receiver, such as a photodiode (not shown) disposed within the barrel 410 to a fiber-ferrule (not shown) disposed within the input port 306 when the transceiver module 300 is connected to the fiber connector 350 (see FIGS. 3A and 3B).

The positioning structure 314 includes a pair of saddles 422 and 424 which are configured to receive the neck 403 of the TOSA 310 and the neck 411 of the ROSA 312, respectively. The saddles 422 and 424 are bordered by posts 426 and 428 and are separated by a post 430. Posts 426-430 are each defined in the positioning structure 314. In the embodiment shown in FIGS. 4A-4C, each of the posts 426-430 includes an insertion member 434, 436, and 438, respectively. The positioning structure 314 additionally includes a post 432 and half posts 433 and 435 for securing the PCB 320.

The integrated lead and trace structure 324 similarly includes a pair of saddles 452 and 454 (seen best in FIG. 4C) configured to receive the necks 403 and 411 of the TOSA 310 and ROSA 312, respectively, as well as posts 456, 458, 460 surrounding and separating the saddles 452 and 454. The posts 456-460 each define a cavity 462, 464, and 466 configured to receive a corresponding insertion member 434-438. The integrated lead and trace structure 324 additionally includes posts 468, 470, 472 and 474 for, among other things, securing the PCB 320.

During assembly, the saddle 422 of the positioning structure 314 is configured to receive the neck 403 of the TOSA 310. The saddle 424 is similarly configured to receive the neck 411 of the ROSA 312. The saddles 422 and 424 secure the TOSA 310 and ROSA 312 in the X and Z directions. The positioning structure 314 is additionally configured to receive the PCB 320, with the post 432 engaging the groove 442 to secure the PCB 320 in the X and Z directions, while the half posts 433, 435 secure the PCB 320 in the Y direction.

After receiving the TOSA 310, ROSA 312, and PCB 320, the integrated lead frame and trace structure 324 can be positioned appropriately. In particular, the cavities 462-466 defined in the posts 456-460 of the integrated lead frame and trace structure 324 can receive the insertion members 434-438 of the posts 426-430 such that the necks 403, 411 of the TOSA 310 and ROSA 312 are also received by the saddles 452, 454 of the integrated lead frame and trace structure 324, thereby securing the TOSA 310 and ROSA 312 in the X, Y, and Z directions. The insertion members 434-438 may be configured to "snap" into the cavities 462-466 in one embodiment. Additionally, the posts 468-474 of the integrated lead frame and trace structure 324 secure the PCB 320 in the Y direction.

Once assembled as shown in FIG. 4A, the components 400 can be inserted into the shell 302 of FIGS. 3A-3C, with the end cap 308 securing the other components relative to the shell 302 in the Z direction. In one embodiment, the dimensions of the shell 302 may be such that it exerts upwards and downwards force on the positioning structure 314 and integrated lead frame and trace structure 324, respectively, such that the structures 314 and 324 securely maintain the positions of the TOSA 310, ROSA 312, and PCB 320. Thus, the positioning structure 314, integrated lead frame and trace structure 324, and end cap 308 mechanically stabilize the TOSA 310, ROSA 312, and PCB 320 within the optoelectronic transceiver module 300 by acting jointly as a PCB carrier.

In addition to providing mechanical stabilization, the integrated lead frame and trace structure 324 enables line-side OOB communications by providing line-side electrical connections from the PCB 320. While described in greater detail below, the integrated lead frame and trace structure 324 includes four electrical traces embedded in a semi-rigid body that may comprise plastic, ABS, PC, Nylon, or PC/ABS, for instance. In one embodiment, the semi-rigid characteristic of the body may advantageously enable easy assembly. In particular, a semi-rigid integrated lead frame and trace structure 324 can be more easily fed through the shell 302 during assembly than a non-semi-rigid structure. Furthermore, integration of the electrical traces within the structure 324, which also acts as a PCB carrier, reduces the number of separate components of the module 300, thereby simplifying the assembly process.

Each of the four electrical traces of the integrated lead frame and trace structure 324 includes a PCB-side contact 476, 478, 480, 482 configured to electrically couple to a corresponding electrical contact 444, 446, 448, 450 on the PCB 320. In one embodiment, the downward and upward forces exerted by the shell 302 on the integrated lead frame and trace structure 324 and PCB 320 (through the positioning structure 314) ensure contact between the PCB-side contacts 476-482 of the integrated lead frame and trace structure 324 and the electrical contacts 444-450 of the PCB 320. As a result, in some embodiments there is no need to solder the PCB-side contacts 476-482 to the corresponding contacts 444-450, thereby simplifying the assembly process. Each of the four electrical traces can additionally include a line-side contact 484, 486, 488, 490 configured to electrically couple to a corresponding electrical contact (see FIG. 7A-7B) on the fiber connector 350.

Figure 5:
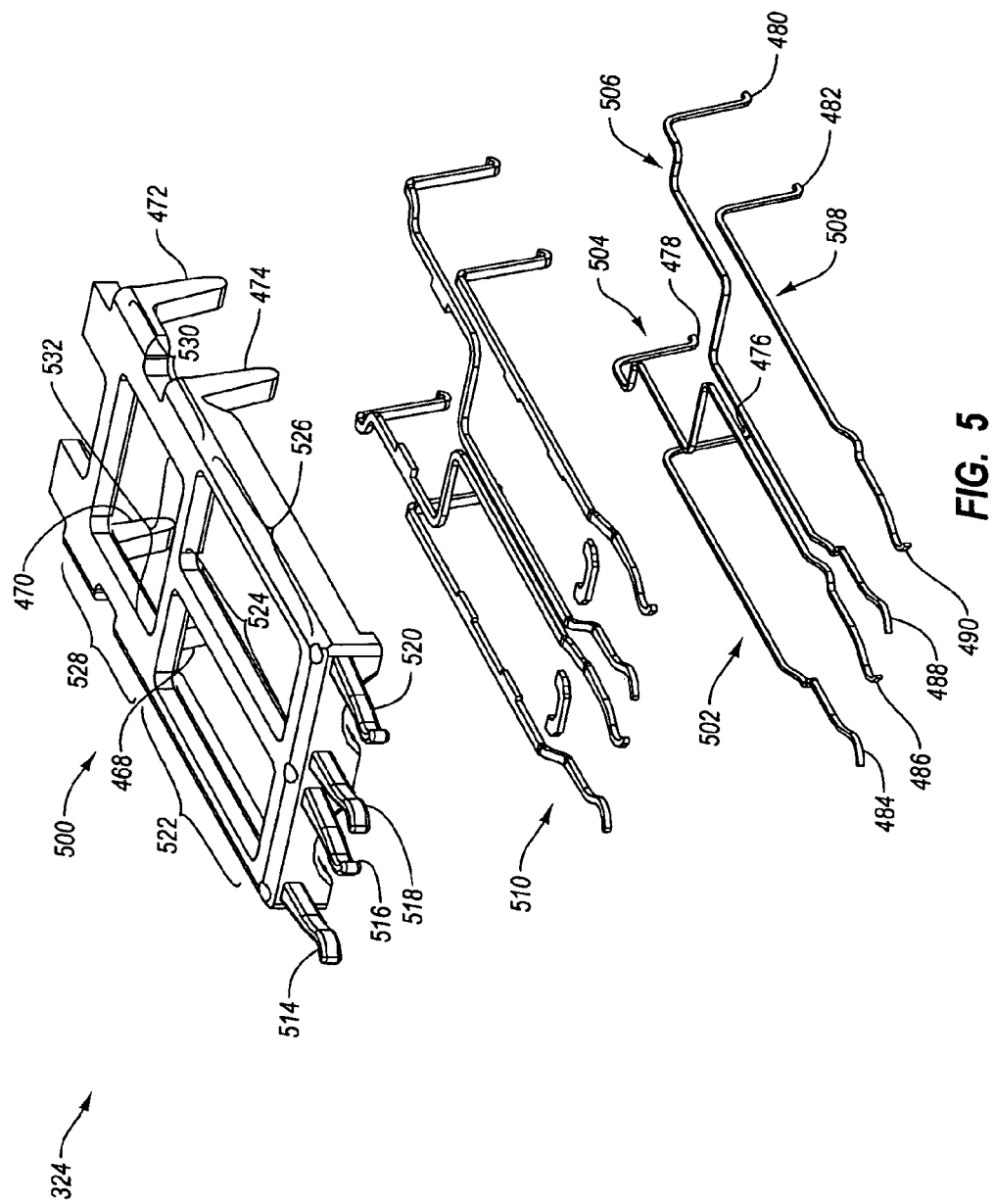
FIG. 5 is an exploded view of an integrated lead frame and trace structure.

With additional reference to FIG. 5, aspects of the integrated lead frame and trace structure 324 are illustrated in greater detail. In particular, the integrated lead frame and trace structure 324 includes a semi-rigid body 500, four separate electrical traces 502, 504, 506, and 508, and optional trace frame 510. The traces can be made of gold, or nickel-plated copper, or any electrically conductive material. The trace frame corresponds to what may be left after a sheet metal lead frame has been over molded with plastic and structural interconnections have been cut away to electrically isolate the individual contacts. It is not required in all embodiments. To aid in manufacturing, all 4 electrical contacts may be joined and stamped out of a single sheet to form the lead frame. This formed sheet may then be inserted into an injection mold machine to mold the plastic insulating and structural material over the contacts. The joining sections of the lead frame holding the contacts together may then be cut away, leaving individual contacts.

In another embodiment, individual contacts may be stitched into a pre molded plastic structure to eliminate the presence of a trace frame 510. Alternately or additionally, each lead may be positioned separately into an injection molding machine. Thus, embodiments of the invention contemplate an integrated lead frame structure 324 with or without a contact frame.

The semi-rigid body 500 may comprise plastic or the like and can be over-molded on the traces 502-508 and trace frame 510 during manufacturing to create the integrated lead frame and trace structure 324. The semi-rigid body portion 500 includes posts 468-474 that help secure the PCB 320 and provide mechanical support for the PCB-side contacts 476-482. Additionally, the semi-rigid body 500 includes posts 514, 516, 518 and 520 that provide mechanical support for the line-side contacts 484-490.

As shown, the semi-rigid body 500 additionally includes various longitudinal members 522, 524, 526, 528 and 530 and a lateral member 532. According to the illustrated embodiment, electrical trace 502 is configured to extend from post 468 through longitudinal member 522 and out post 514. Electrical trace 504 is configured to extend from post 470 through longitudinal member 528, through a portion of lateral member 532, through longitudinal member 524, and out post 516. Electrical trace 506 is configured to extend from post 472 through longitudinal member 530, through a portion of lateral member 532, through longitudinal member 524, and out post 518. Finally, electrical trace 508 is configured to extend from post 474 through longitudinal member 526 and out post 520.

In the illustrated embodiment, the semi-rigid body 500 can electrically insulate the traces 502-508 from the shell 302, which may comprise a metal EMI shield in one embodiment. The separation of the posts 514-520 allows the posts 514-520 (and traces 502-508) to be inserted through small independent openings in the shell 302. Alternately, the posts 514-520 can be inserted through a single large opening in the shell 302.

According to embodiments of the invention, the integrated lead frame and trace structure 324 can be implemented within an SFP+ optoelectronic transceiver module or other relatively small optoelectronic module (e.g., SFP, SFF, XFP, or the like) to bring electrical contacts to the front of the optical connection. In a conventional SFP+ or other relatively small optoelectronic module, bringing electrical contacts to the front of the optical connection can be problematic due to space constraints, EMI factors, and compatibility. In the present embodiment of the invention, however, the integrated lead frame and trace structure 324 saves space by providing the desired electrical contacts while also acting as a PCB carrier (which would otherwise be separately included). Alternately or additionally, apertures for EMI can be minimized by using independent openings for each contact as explained above. Alternately or additionally, the integrated lead frame and trace structure 324 can use existing LC connector (or the like) geometry as shown, enabling backwards compatibility with existing connectors.

Figure 6A:
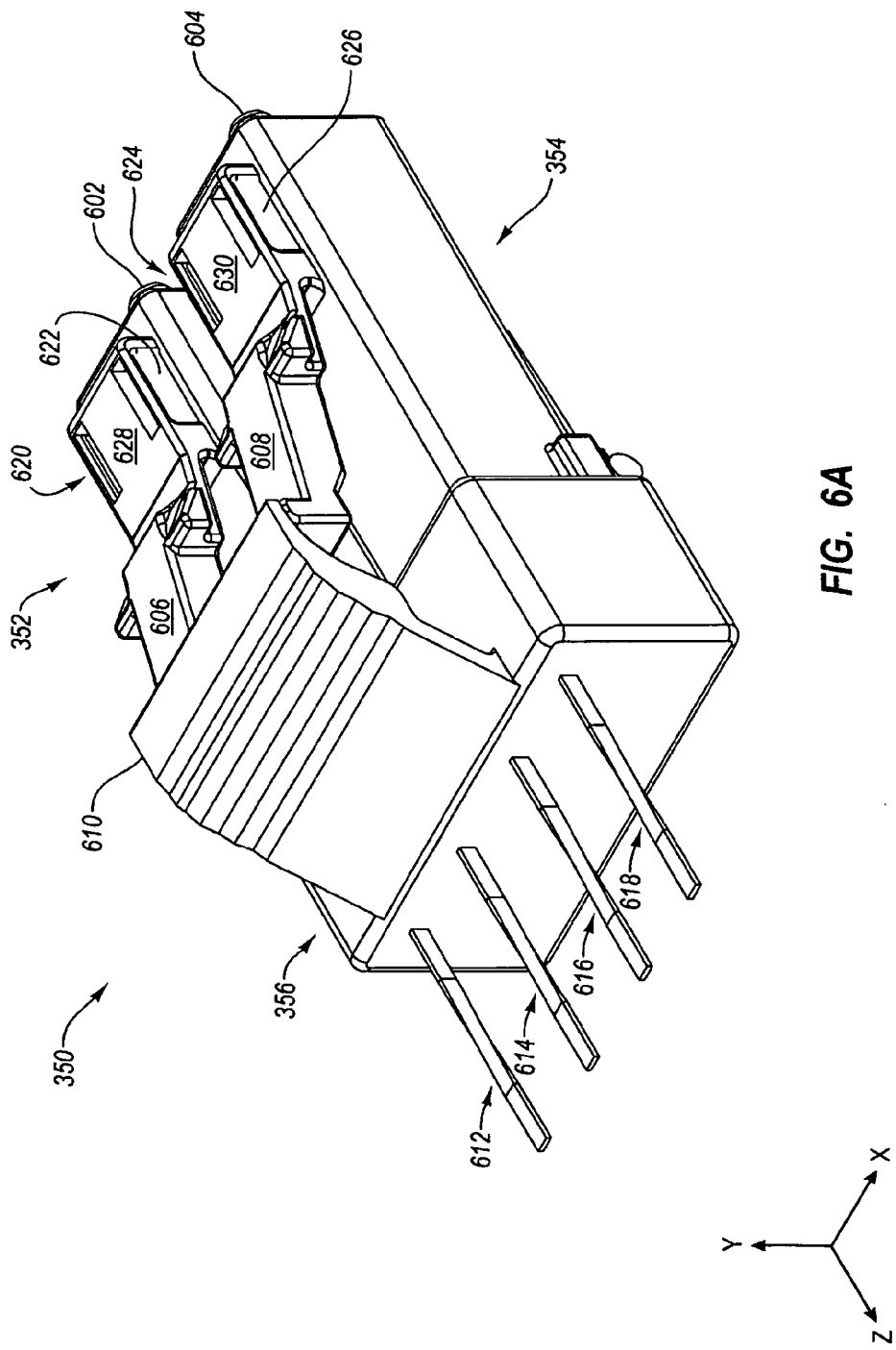
FIGS. 6A-6B depict different views of an optical connector with integrated electrical traces according to embodiments of the invention.
Figure 6B:
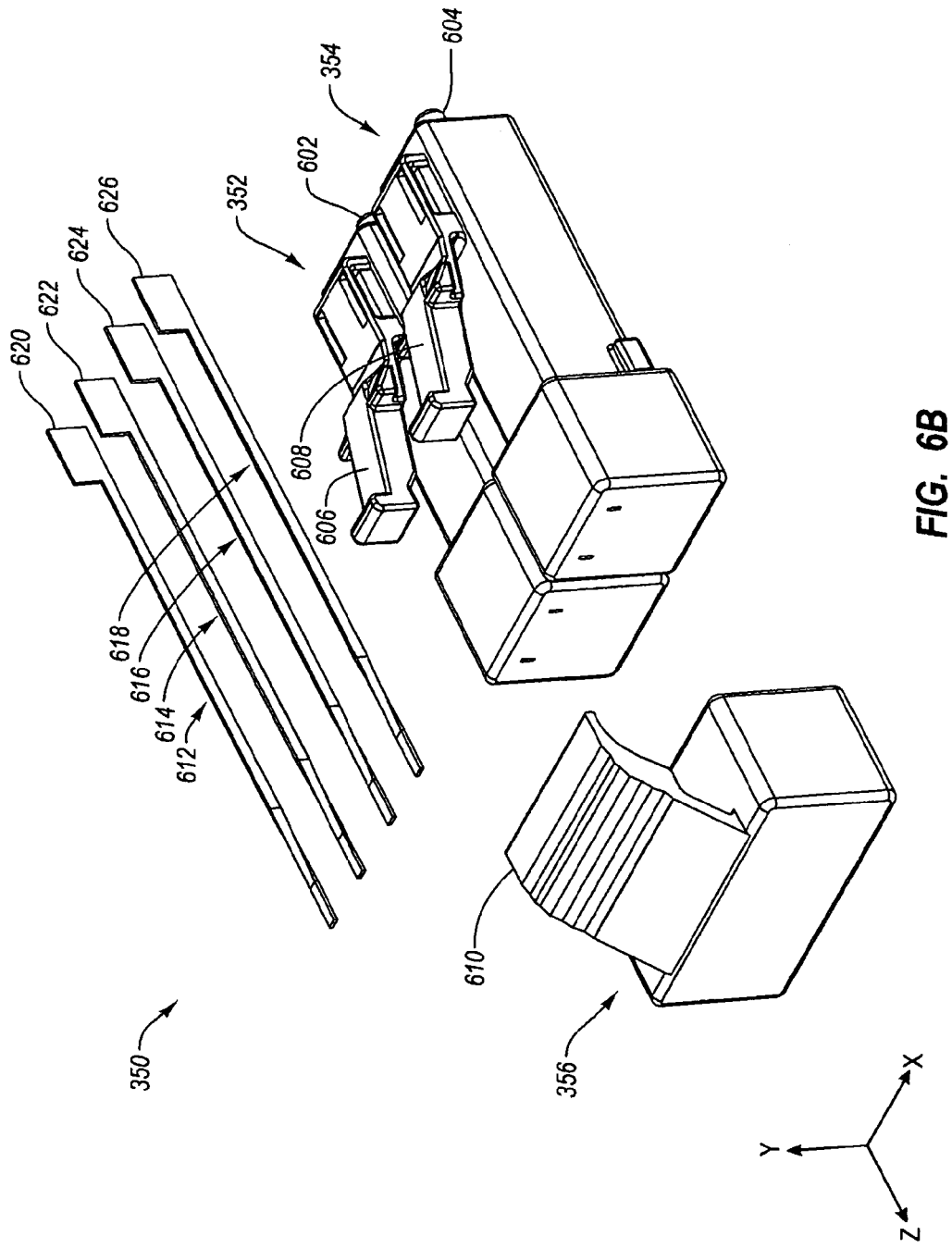

With additional reference to FIGS. 6A and 6B, aspects of the fiber optic connector 350 are illustrated and described in greater detail. As previously explained, the fiber optic connector 350 includes a transmit LC connector 352, a receive LC connector 354, and a connector removal mechanism 356. Each of the LC connectors 352, 354 includes a ferrule 602 or 604 configured to couple light from the TOSA 310 into a corresponding first optical fiber or from a corresponding second optical fiber into the ROSA 312.

Each LC connector 352, 354 additionally includes a retaining latch 606 or 608 configured to engage a corresponding slot (not shown) in the output port 304 and input port 306, respectively, of the optoelectronic transceiver module 300, thereby securing the LC connectors 352, 354 within the output port 304 and input port 306. The connector removal mechanism 356 includes a tab 610. Depressing the tab 610 causes the retaining latches 606, 608 to disengage from the corresponding slots in the output and input ports 304, 306, allowing the LC connector 350 to be removed from the optoelectronic transceiver module 300.

The fiber optic duplex connector 350 additionally includes embedded electrical traces 612, 614, 616, and 618. Each of the fiber optic connector's electrical traces 612-618 includes a contact 620, 622, 624, and 626 configured to be electrically coupled to a corresponding line-side contact 484-490 of the integrated lead frame and trace structure 324 when the fiber optic connector 350 is inserted into the optoelectronic transceiver module 300. In this manner, the fiber optic connector 350 can electrically communicate with a microcontroller of the transceiver module 300. For instance, the fiber optic connector 360 can receive digital diagnostic data from the microcontroller.

The received digital diagnostic data can be sent from the fiber optic connector 350 to an OOB network monitoring resource via a hardwired or wireless link. Alternately or additionally, the fiber optic connector can receive data from a network resource for the transceiver module 300 via a hardwired or wireless link. For instance, the traces 612-618 may be electrically coupled via a hardwired link to an OOB network resource. Alternately or additionally, the traces may be electrically coupled to a wireless transmitter that can optionally be included within the fiber optic connector 350 or as a separate component.

In embodiments implementing a wireless transmitter, the wireless transmitter may comprise a radio frequency ("RF") transceiver. RF transceivers are circuitry and/or hardware that convert electrical data to RF signals, and vice versa. The RF transceivers, for example, may contain a microchip enabled with RF circuitry. In some embodiments, the microchip is able to transmit and receive over distances of up to 5 miles. In other embodiments, the microchip can transmit and receive over distances of more than 5 miles. Alternatively, the microchip can transmit and receive at a relatively lower frequency to transmit an RF signal to a probe or repeater station (not shown) which can then retransmit the signal at a higher frequency. However, other wireless transmission techniques can be used and are within the scope of the present invention.

Generally, wireless devices of the present invention can be employed to reduce or minimize, where possible, the number of physical connections to a network so as to decrease the cost of implementing a diagnostic system. However, a "wireless" component may also have some elements of physical connections (e.g., metal wire or fiber optic cable) in order to allow the component to perform its normal functions.

In any event, data can be electrically communicated out-of-band from the transceiver module 300 to a network resource, and/or vice versa, via the embedded traces 502-508 and 612-618.

Returning to FIGS. 6A-6B, each LC connector 352, 354 includes a retaining latch base 628, 630. The traces 612-618 are embedded within the connector 350 such that the contacts 620-626 are positioned on opposite sides of the retaining latch bases 628, 630. In particular, contact 620 is positioned on one side of retaining latch base 628 while contact 622 is positioned on the opposite side. Similarly, contact 624 is positioned on one side of the retaining latch base 630 while contact 626 is positioned on the opposite side. Positioning the paired contacts 620-626 on opposite sides of the retaining latch bases 628, 630 can result in left-right balancing (e.g., balancing in the X direction) of the contact forces on the fiber optic connector 350, as illustrated in FIGS. 7A and 7B.

Figure 7A:
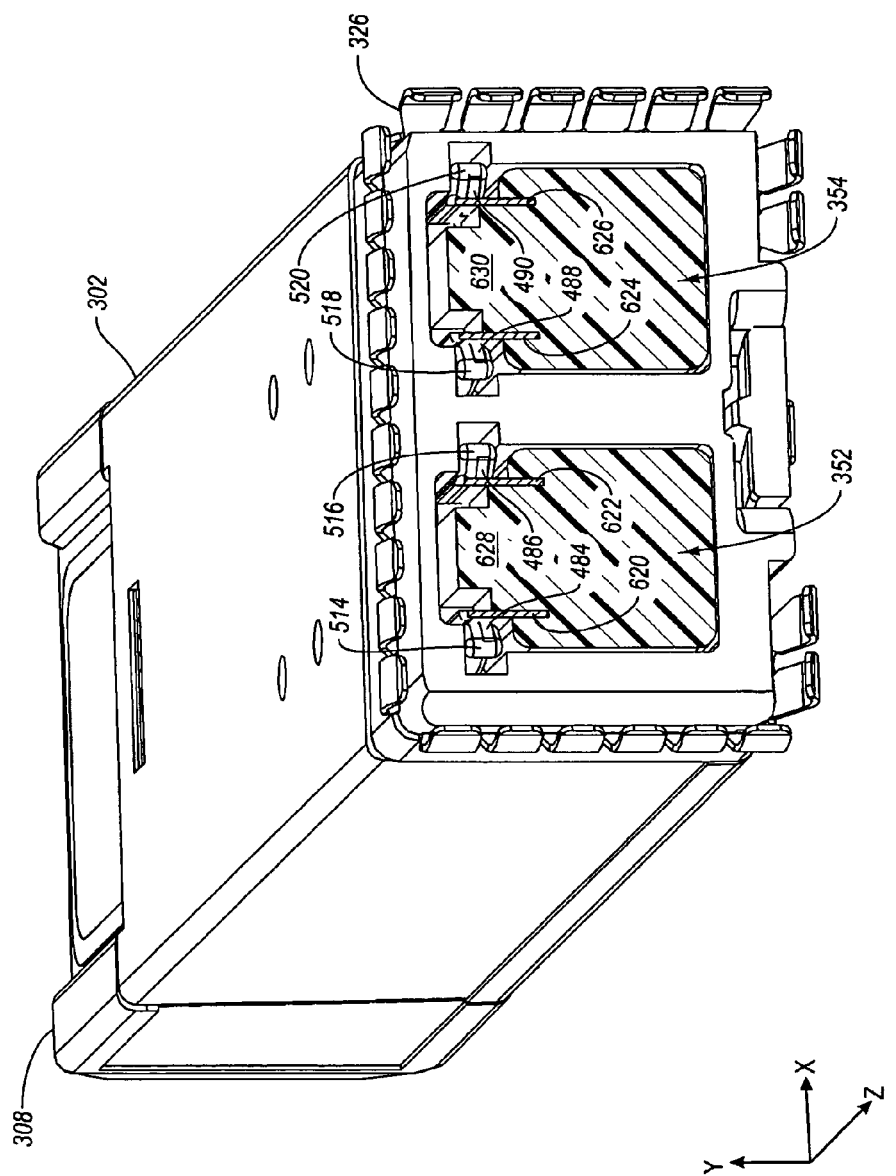
FIGS. 7A-7B are cross-sectional views of the mechanically coupled optoelectronic transceiver module and optical connector of FIG. 3B, further illustrating the electrical coupling of the optoelectronic transceiver module to the optical connector.
Figure 7B:
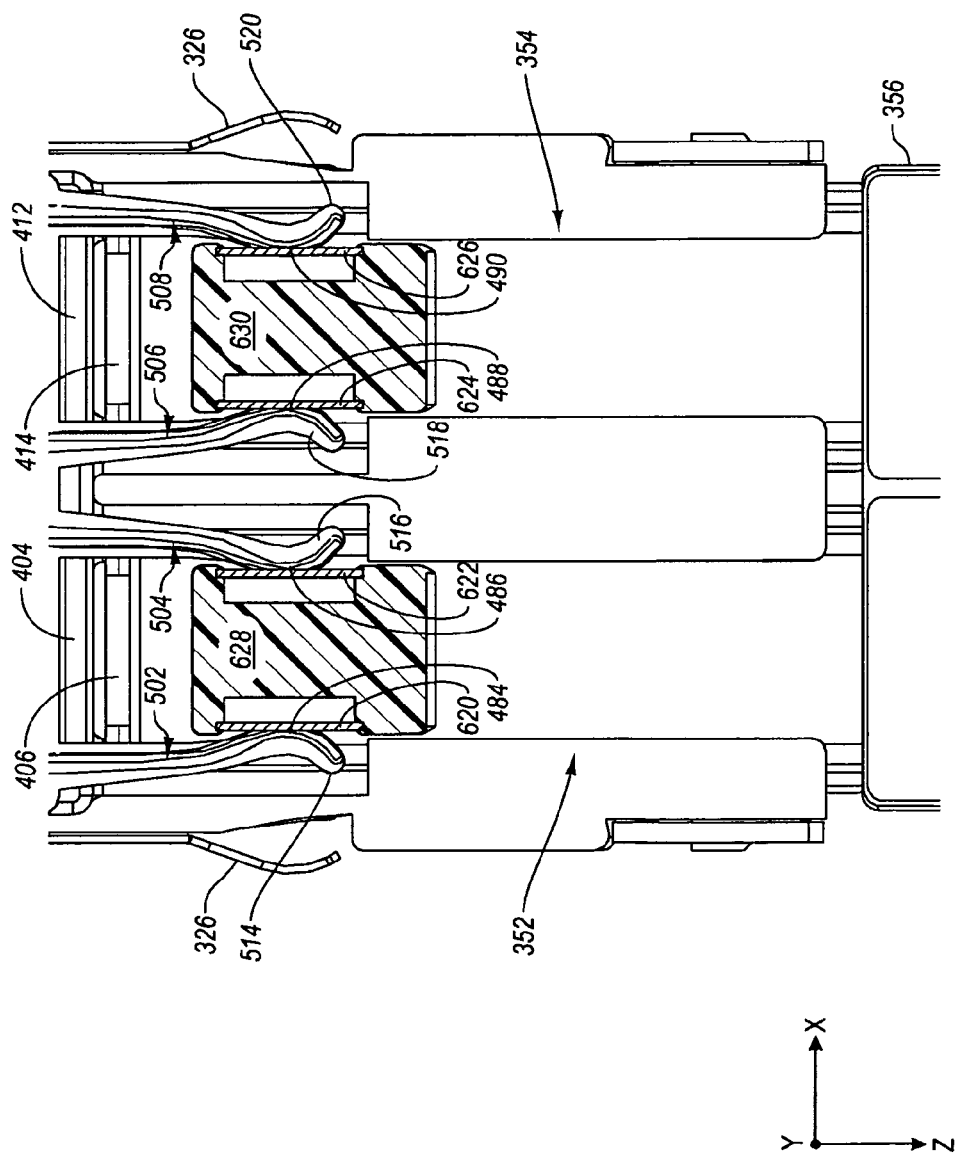

With additional reference to FIGS. 7A and 7B, cross-sectional views of the coupled fiber optic connector 350 and optoelectronic transceiver module 300 of FIG. 3B are illustrated. In particular, FIG. 7A illustrates a cross-sectional view in the XY plane, corresponding to cutting plane line 7A in FIG. 3B. FIG. 7B illustrates a cross-sectional view in the XZ plane, corresponding to cutting plane line 7B in FIG. 3B.

As shown in FIGS. 7A and 7B, when the LC connectors 352, 354 are inserted into the output and input ports of the optoelectronic transceiver module 300, the line-side contacts 484-490 of the integrated lead frame and trace structure 324 are coupled to the corresponding contacts 620-626 of the fiber optic connector 350. FIGS. 7A and 7B further illustrate contact pairs 620-626 positioned on opposite sides of the release latch bases 628 and 630, respectively.

According to one embodiment of the invention, the distance between the contact surfaces of the posts 514 and 516 (e.g., the distance between contacts 484 and 486) prior to insertion of the LC connector 352 may be slightly less than the distance between the contact surfaces of the connector contacts 620 and 622. Additionally, as previously mentioned, the posts 514, 516 (which are part of the semi-rigid body 500) may comprise a semi-rigid plastic or other material, allowing the posts 514, 516 to bend or flex a small amount such that the LC connector 352 may be inserted, with the posts 514, 516 exerting opposite forces on, or squeezing, the contacts 620, 622. Thus, upon insertion, post 514 exerts a contact force (through line-side contact 484) on connector contact 620 in the positive X direction while post 516 exerts a contact force (through line-side contact 486) on connector contact 622 in the negative X direction. As a result, the contact forces on the LC connector 352 can be left-right balanced, thereby substantially eliminating biasing of the corresponding optical fiber. Similarly, the contact forces on the LC connector 354 can be left-right balanced.

With additional reference to FIGS. 8-12, a second embodiment of an OOB line-side electrical interface 900 is described that can be implemented to provide OOB line-side electrical communication between an optoelectronic device 800 and optical connector 850 (or other line-side device). As shown, the OOB line-side electrical interface 900 is implemented in conjunction with an SFP+ transceiver 800 and dual LC optical connector 850, although this is not required in all embodiments. In particular, the OOB line-side electrical interface 900 can be implemented in conjunction with other optoelectronic devices and/or other optical connectors or line-side devices.

Figure 8:
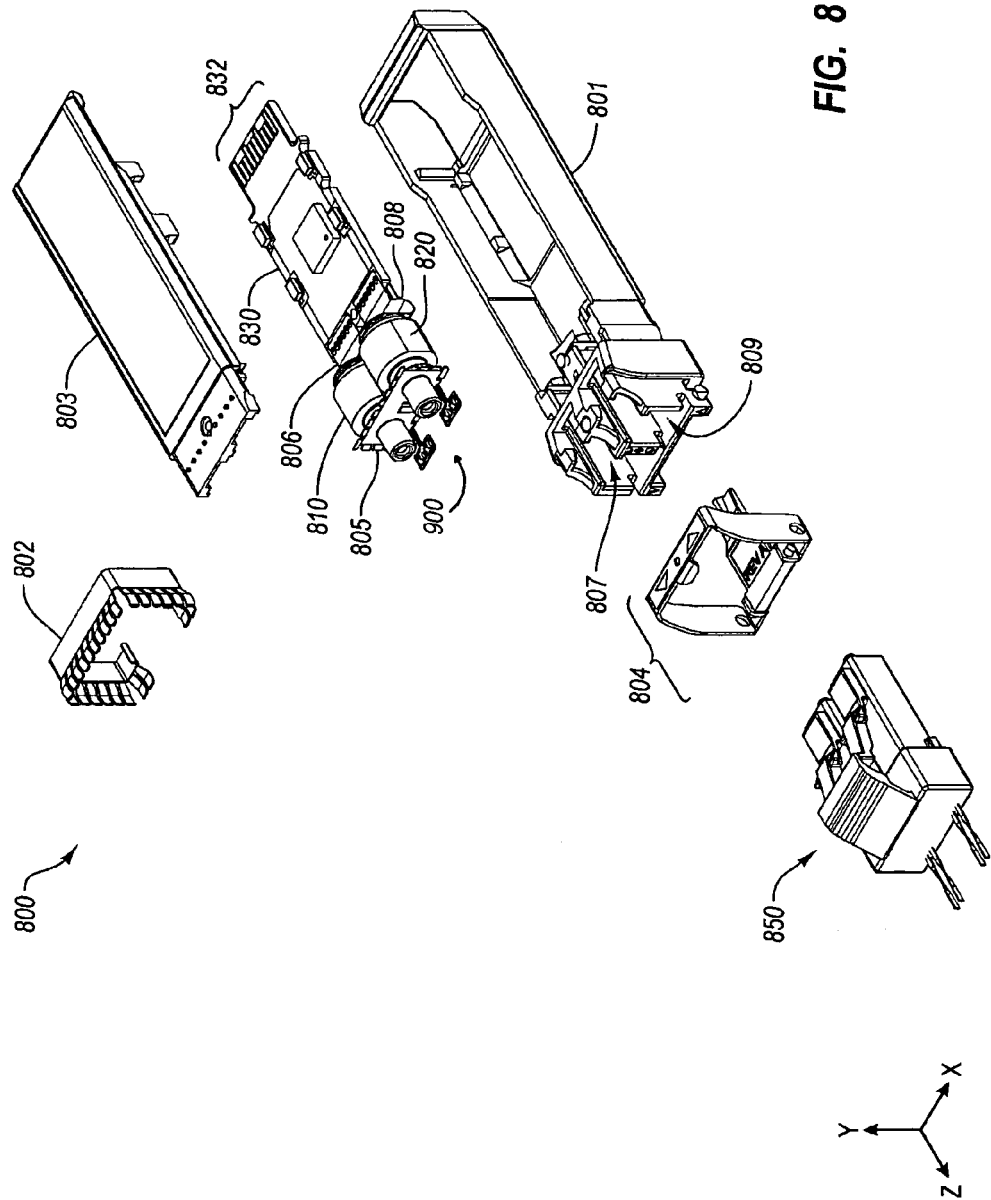
FIG. 8 depicts an exploded view of an optoelectronic device and optical connector configured to electrically communicate using a second embodiment of an OOB line-side electrical interface.

FIG. 8 illustrates an exploded view of optoelectronic transceiver module 800 and optical connector 850. The transceiver module 800 of FIGS. 8-12 is similar in operation and in many other respects to the transceiver module 300 of FIGS. 3A-7B. In particular, the transceiver module 800 includes an EMI collar clip 802, latching mechanism 804, TOSA 810, ROSA 820, PCB 830 having an edge connector 832, and electrical interfaces 806, 808 for electrically connecting the TOSA 810 and ROSA 820 to the PCB 830.

However, the transceiver module 800 includes a bottom shell 801 and rotatable top shell 803, rather than the shell 302 and endcap 308. Embodiments of a bottom shell and rotatable top shell are disclosed in greater detail in U.S. patent application Ser. No. 12/039,677, entitled "ROTATABLE TOP SHELL" and filed Feb. 28, 2008, which application is herein incorporated by reference in its entirety. The bottom shell 801 includes output port 807 and input port 809, configured to receive LC connectors or plugs of the optical connector 850. Additionally, the transceiver module 800 includes an optical subassembly ("OSA") positioning plate 805 configured to secure and support the TOSA 810 and ROSA 820 with respect to the bottom shell 801 and top shell 802, embodiments of which are disclosed in greater detail in U.S. patent application Ser. No. 12/039,598, entitled "POSITIONING PLATE FOR OPTICAL SUBASSEMBLY" and filed Feb. 28, 2008, which application is herein incorporated by reference in its entirety.

Additionally in the embodiment of FIG. 8, mechanical and structural support for the TOSA 810, ROSA 820 and PCB 830 can be provided by the bottom shell 801, top shell 803, and OSA positioning plate 805, without using a positioning structure 314 and/or integrated lead frame and trace structure 324. Accordingly, electrical connectivity from the PCB 830 to the line-side of the optoelectronic device 800 can be provided via an OOB line-side electrical interface 900 rather than using an integrated lead frame and trace structure.

Figure 9:
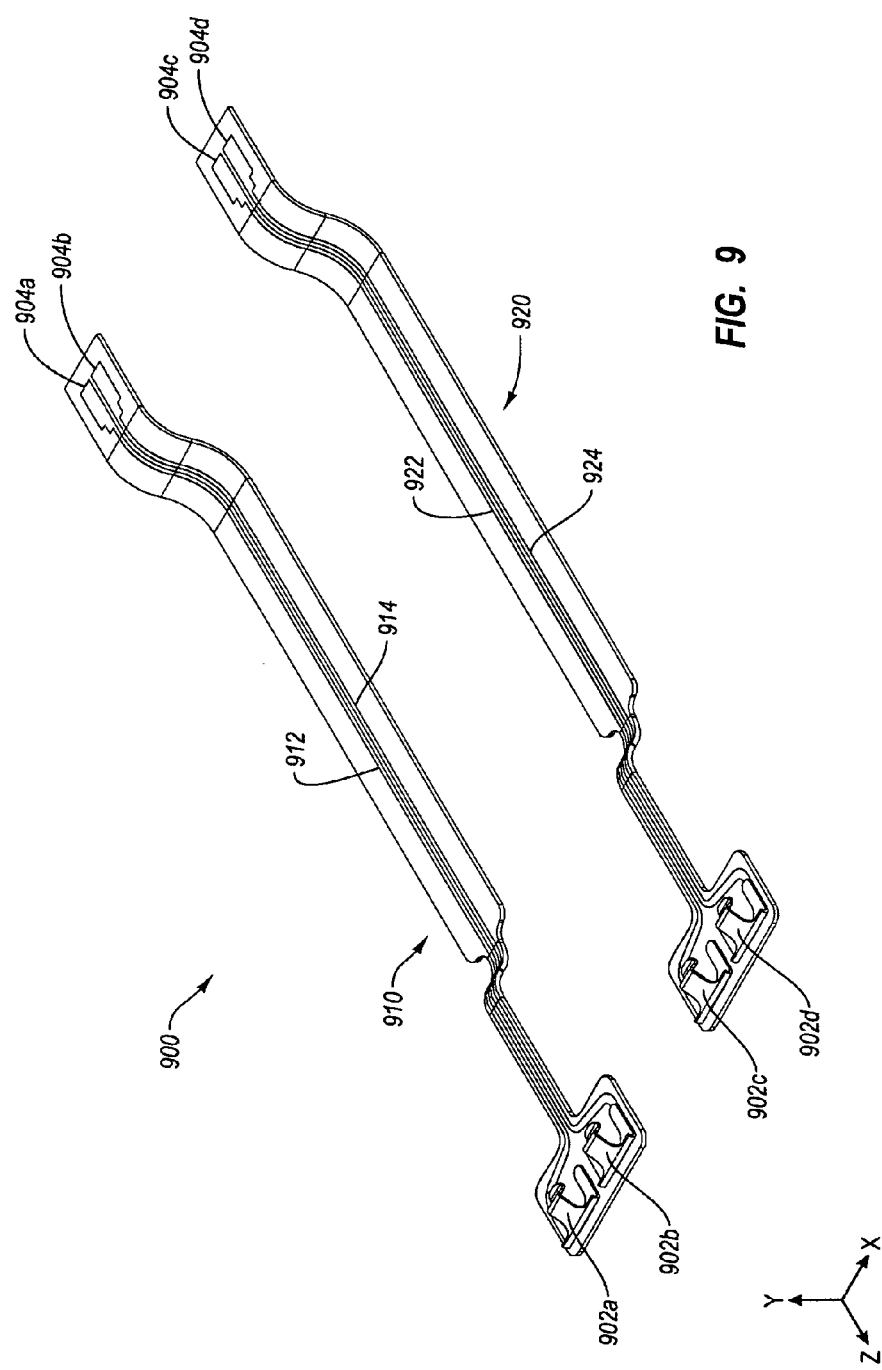
FIG. 9 is a perspective view of the OOB line-side electrical interface of FIG. 8.

The OOB line-side electrical interface 900 is illustrated in greater detail in FIG. 9 and comprises a plurality of flex circuits 910, 920. Flex circuit 910 includes a plurality of electrical traces 912 and 914. Each trace 912, 914 includes a line-side contact 902a, 902b, and a PCB-side contact 904a, 904b, respectively. Similarly, flex circuit 920 includes a plurality of electrical traces 922 and 924. Each trace 922, 924 includes a line-side contact 902c, 902d, and a PCB-side contact 904c, 904d, respectively. Line-side contacts 902a-902d (collectively referred to herein as "line-side contacts 902") are configured to be coupled to corresponding contacts on a line-side device, such as on the dual LC optical connector 850 of FIG. 8, and may be positioned within the output port 807 and input port 809 of the transceiver module 800, as illustrated in greater detail in FIG. 11. PCB-side contacts 904a-904d (collectively referred to herein as "PCB-side contacts 904") are configured to be coupled to corresponding contacts on the bottom of the PCB 830 of FIG. 8, as illustrated in greater detail in FIGS. 10B and 10C.

Figure 10A:
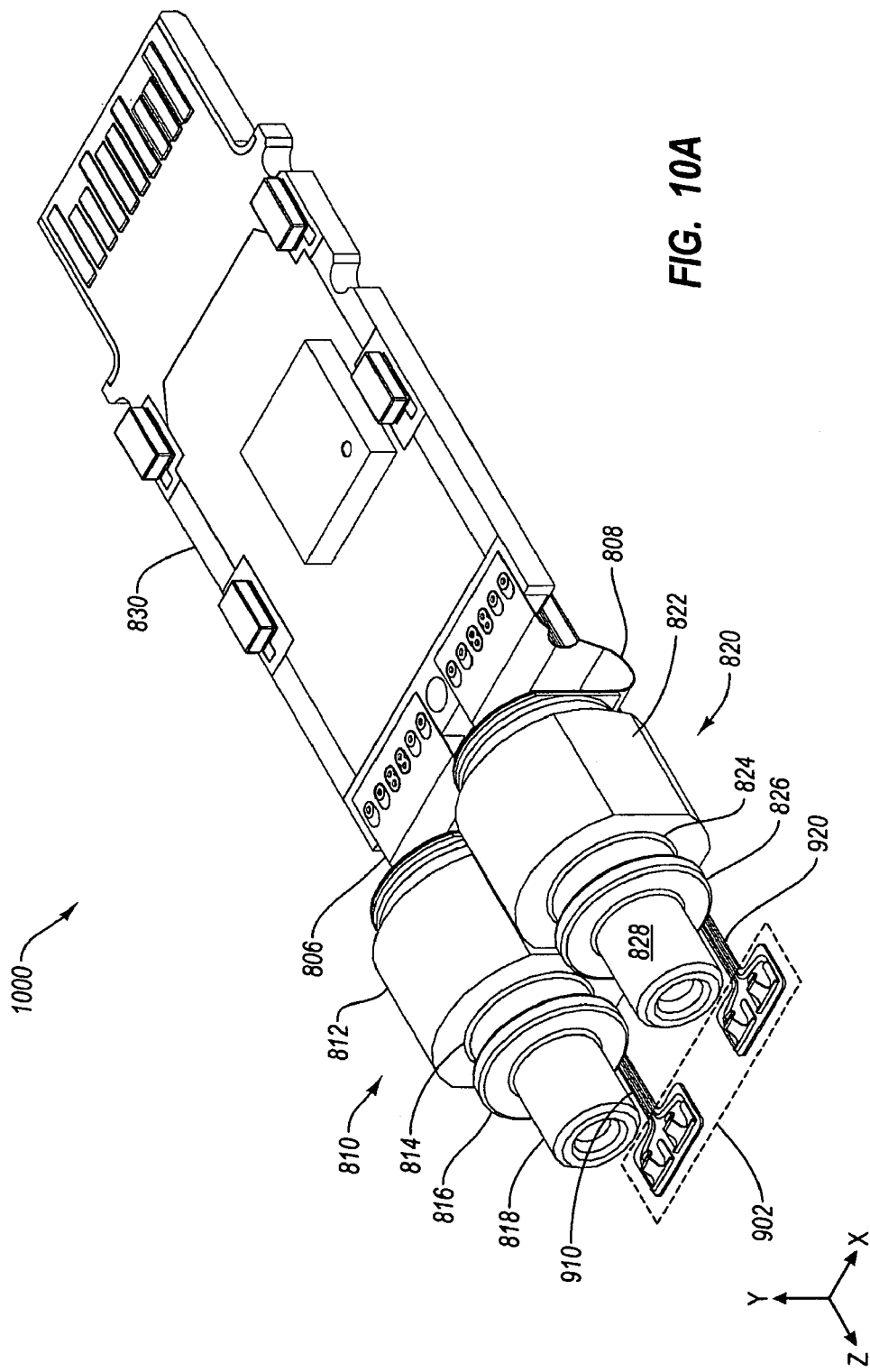
FIGS. 10A-10C illustrate various views of some of the components of the optoelectronic device of FIG. 8.
Figure 10B:
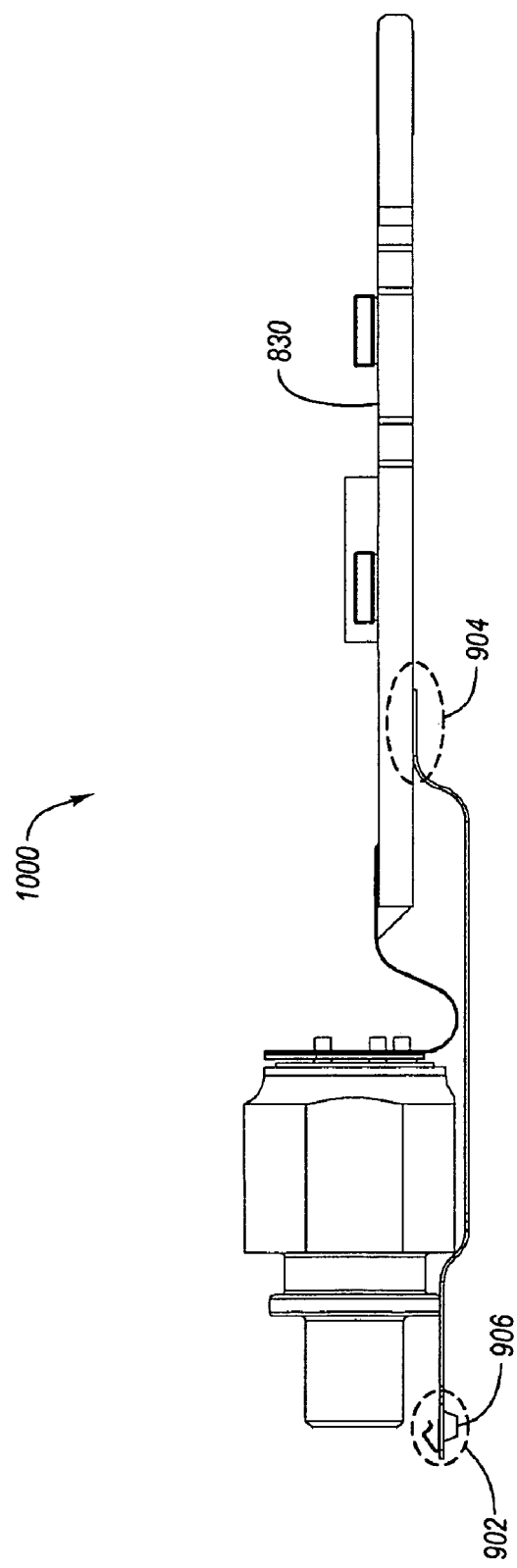
Figure 10C:
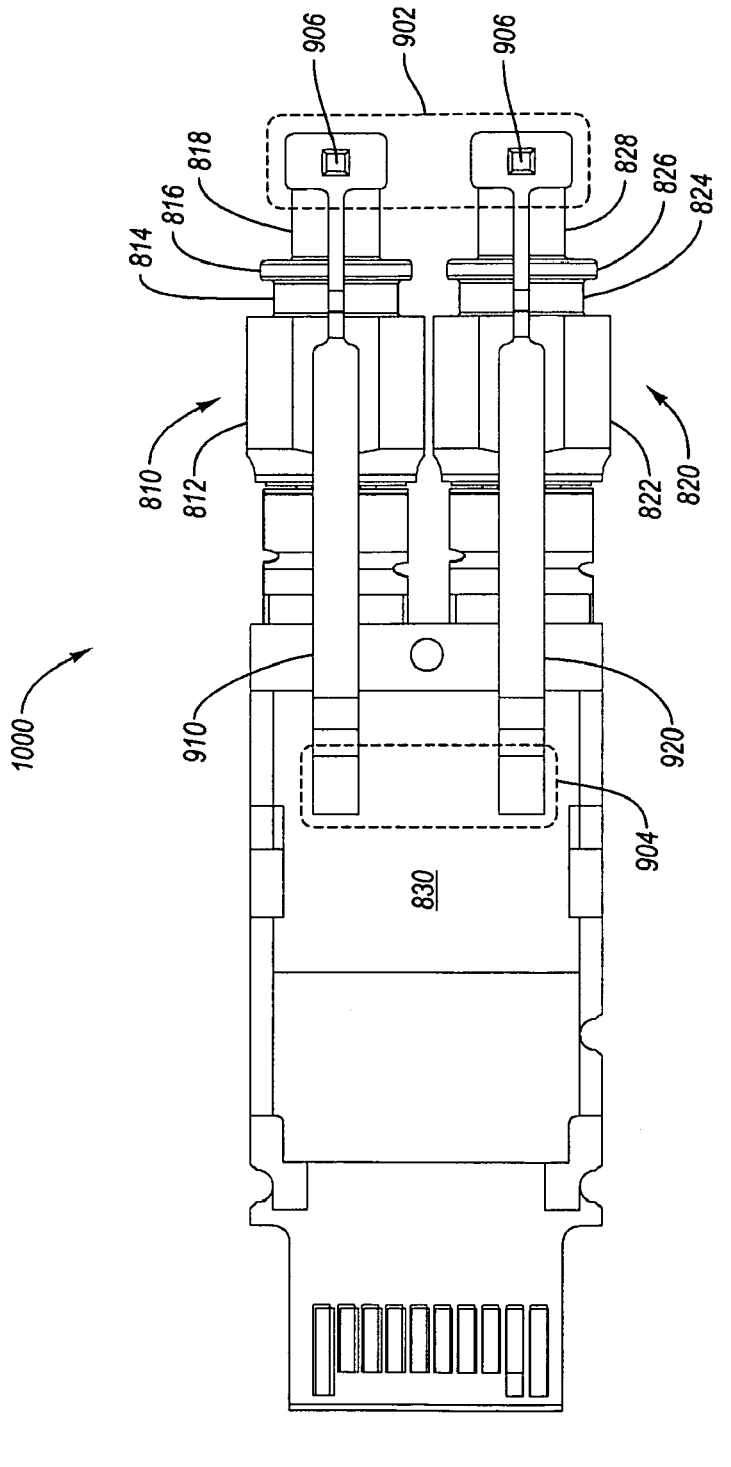

FIGS. 10A-10C together illustrate the positional relationship of the OOB line-side electrical interface 900 to various components 1000 of the transceiver module 800. As shown, the plurality of flex circuits 910 and 920 of the OOB line-side electrical interface 900 run along at least a portion of the undersides of the PCB 830, TOSA 810, and/or ROSA 820. The plurality of PCB-side contacts 904 are shown electrically coupled to corresponding contacts on the PCB 830. In some embodiments, the PCB-side contacts 904 may be permanently electrically coupled to the corresponding contacts on the PCB 830 using solder, an electrically conductive adhesive, or other coupling means, although this is not required in all embodiments.

The line-side contacts 902 are illustrated near the line-side of the TOSA 810 and ROSA 820. As will be described further with respect to FIGS. 11A and 11B, the line-side contacts 902 are positioned within the output port 807 and input port 809 of the transceiver module 800 where they can be electrically coupled to corresponding contacts of an optical connector inserted into the output and input ports. Alternately or additionally, they can be electrically coupled to other line-side devices and/or may be positioned elsewhere at the line-side of the transceiver module 800. Although not required in all embodiments, an epoxy or other adhesive 906 may be used to secure the line-side end of each flex circuit 910, 920 within a corresponding cavity or recess of the bottom shell 801.

Similar to the TOSA 310 and ROSA 312 of FIGS. 3A-3C, each of the TOSA 810 and ROSA 820 includes a barrel 812, 822, a neck 814, 824, a flange 816, 826, and a nose piece 818, 828 defining a port configured to optically connect an optical transmitter or received disposed within the barrel 812 or 822 with a corresponding fiber-ferrule (not shown) disposed within the corresponding output port or input port of the transceiver module 800.

Figure 11A:
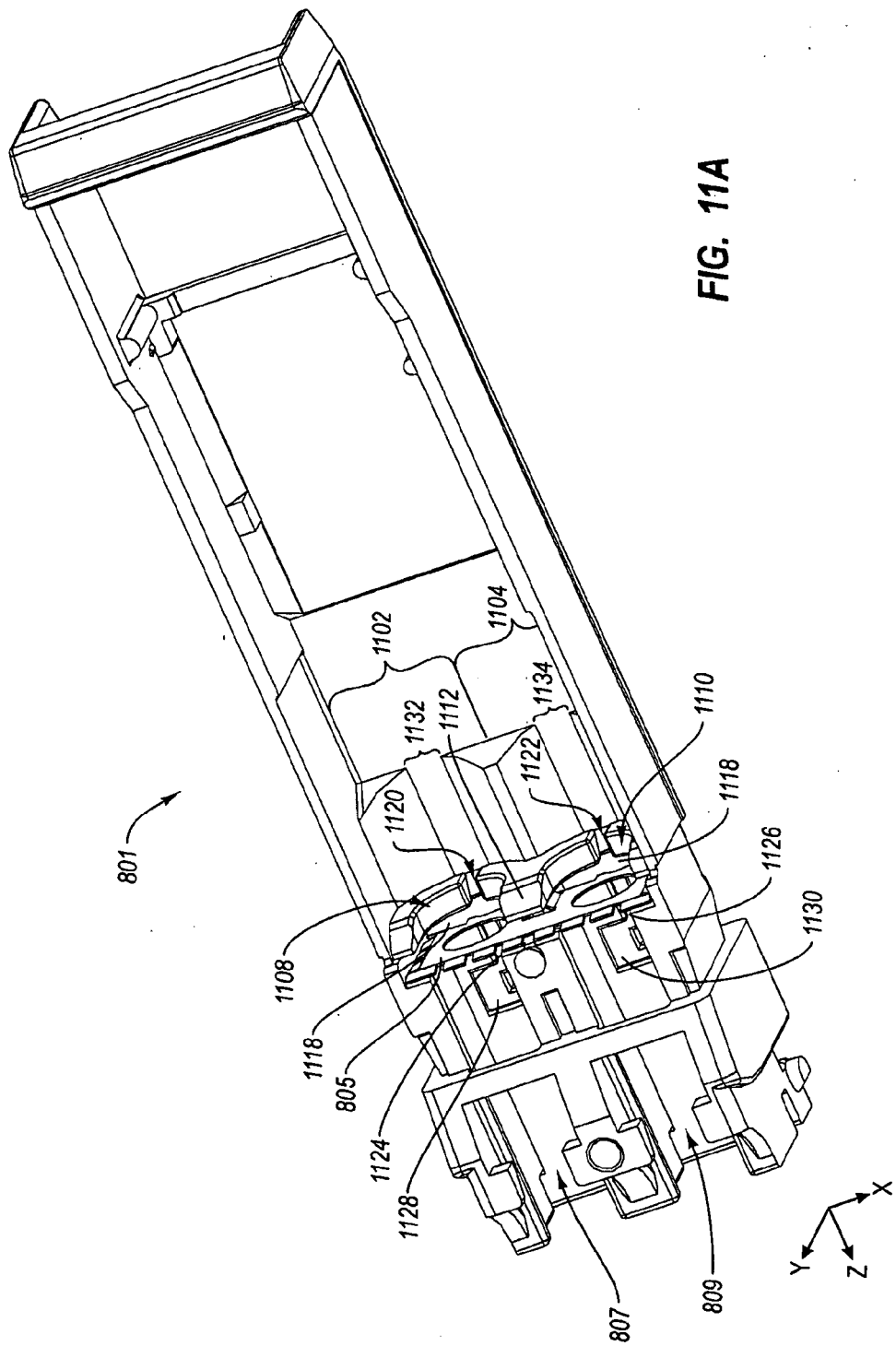
FIGS. 11A and 11B depict features of an optoelectronic device bottom shell adapted to accommodate the OOB line-side electrical interface of FIG. 9.

Turning now to FIG. 11A, features of the bottom shell 801 are described for accommodating the OOB line-side electrical interface 900. As a preliminary matter, features of the bottom shell 801 will be described for securing the TOSA 810 and ROSA 820 within the bottom shell 801.

The bottom shell 801 includes a plurality of large saddles 1102 and 1104 separated by a ridge 1106, a plurality of small saddles 1108 and 1110 separated by a post 1112, a slot 1118, an optical output port 807, and an optical input port 809. OSA positioning plate 805 is illustrated in its assembled position within the slot 1118. As explained in the Ser. No. 12/039,598 application referred to above, the OSA positioning plate 805 defines two holes configured to fit over the nose pieces 818, 828 of the TOSA 810 and ROSA 820, respectively, and is configured to fit snug against the flanges 816, 826 of the TOSA and ROSA. In a typical assembly process, the OSA positioning plate 805 may be positioned over the nose pieces 818, 828 and snug against the flanges 816, 826, before the OSA positioning plate 805, TOSA 810, and ROSA 820 are placed within the bottom shell 801. The OSA positioning plate 805 may include a slot configured to engage a ridge within the slot 1118. The slot 1118 is sized to receive the OSA positioning plate 805 and the flanges 816, 826. The small saddles 1108, 1110 are sized and configured to receive the necks 814, 824 of the TOSA and ROSA. The large saddles 1102, 1104 are configured to receive the barrels 812, 822 of the TOSA and ROSA.

As mentioned above, the flex circuits 910, 920 are configured to run along the underside of the TOSA 810 and/or ROSA 820. To that end, each large saddle 1102, 1104 defines a valley 1132, 1134 at its low point wherein the flex circuits 910, 920 can be positioned. Each small saddle 1108, 1110 defines a channel 1120, 1122 at its low point whereby the flex circuits 910, 920 can pass through the bottom shell 801 to the optical ports 807, 809. Furthermore, each optical port 807, 809 defines a channel 1124, 1126 for receiving the flex circuits 910, 920. Each of the channels 1124, 1126 within optical ports 807, 809 terminates at a cavity or recess 1128, 1130 configured to receive the line-side ends of the flex circuits 910, 920, including the line-side contacts 902a-902b and 902c-902d, respectively.

Figure 11B:
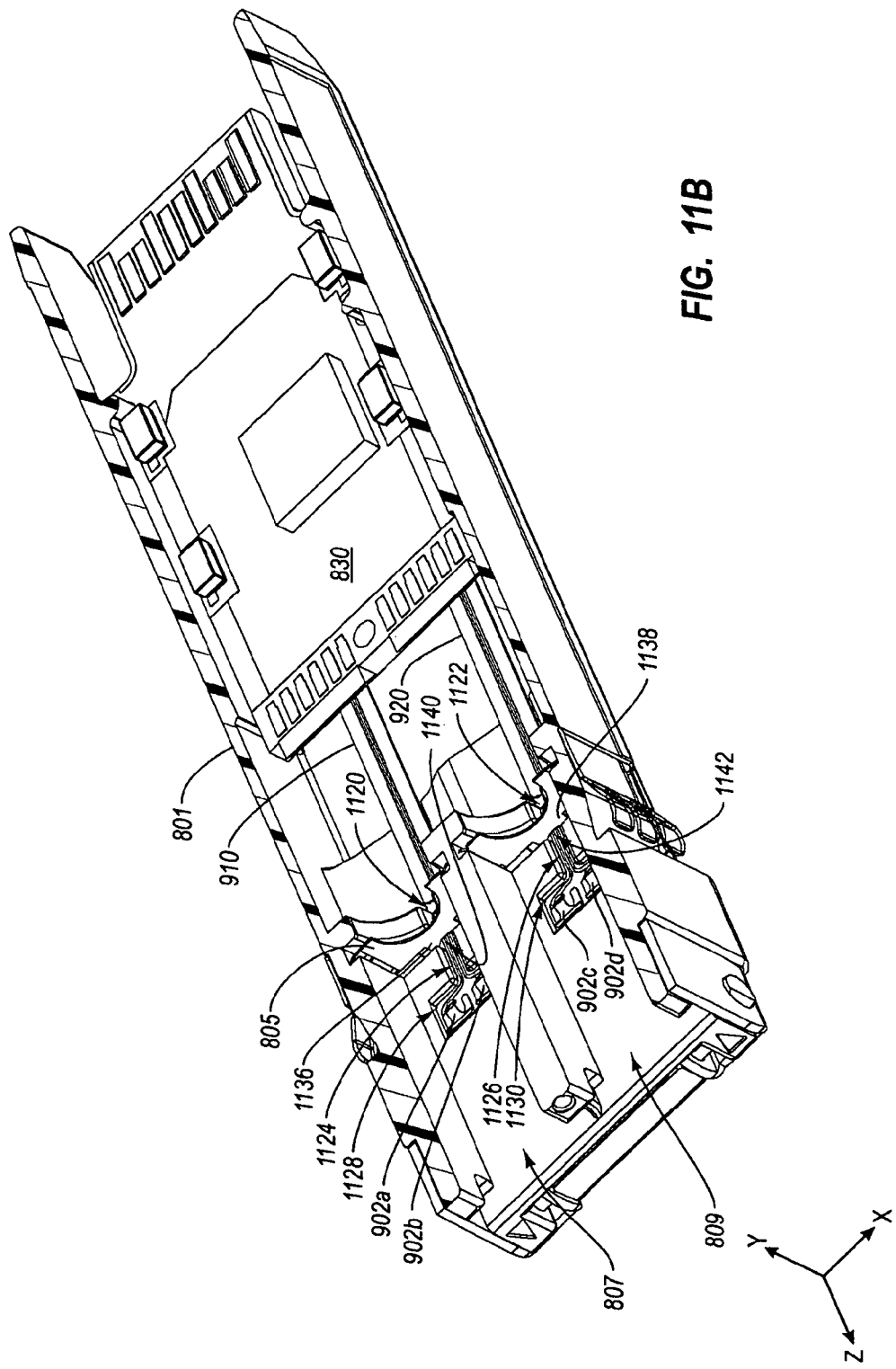

FIG. 11B is a perspective cross-sectional view of the bottom shell 801 illustrated in FIG. 11A, further illustrating the positioning of the PCB 830 and flex circuits 910, 920 within the bottom shell 801. As shown, the flex circuit 910 extends from the underside of the PCB 830, through the valley 1132 in the bottom of the large saddle 1102, through the channel 1120 defined in the small saddle 1108, and through the channel 1124 defined in the output port 807 to the cavity or recess 1128 which terminates the channel 1124. The contacts 902a and 902b are positioned within the cavity 1128. Similarly, the flex circuit 920 extends from the underside of the PCB 830, through the valley 1134 in the bottom of the large saddle 1104, through the channel 1122 defined in the small saddle 1110, and through the channel 1126 defined in the input port 809 to the cavity or recess 1130 which terminates the channel 1126. The contacts 902c and 902d are positioned within the cavity 1130.

As shown in FIG. 11B, the OSA positioning plate 805 may act as an EMI shield or barrier and includes a plurality of flanges 1136, 1138 along its bottom edge. Each of the flanges 1136, 1138 defines an arch 1140, 1142 or other recess large enough for the flex circuits 910, 920 to pass under. The arches 1140, 1142 or other recess defined by the flanges 1136, 1138 can be minimized to reduce EMI as much as possible while still allowing the flex circuits 910, 920, including paired electrical traces 912, 914 and 922, 924, to pass under the flanges 1136, 1138.

Figure 12:
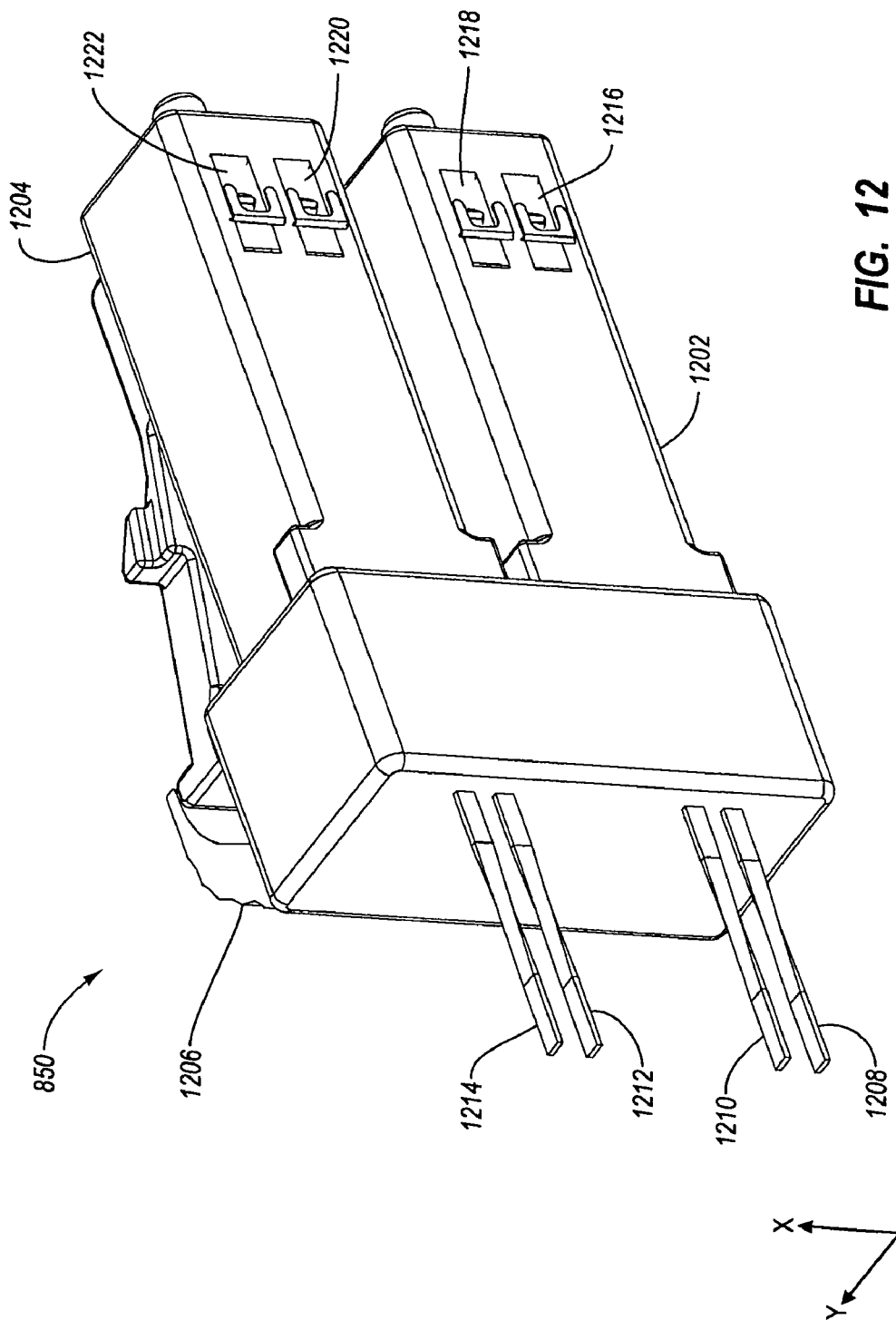
FIG. 12 illustrates one embodiment of the optical connector of FIG. 8.

With additional reference to FIG. 12, aspects of a dual LC optical connector 850 that can be implemented with the OOB line-side electrical interface 900 are illustrated and described in greater detail. The fiber optic connector 850 includes a transmit LC connector or plug 1202 configured to be received within the output port 807 of transceiver 800, a receive LC connector or plug 1204 configured to be received within the input port 809 of transceiver 800, and a connector removal mechanism 1206. Similar to the LC connectors 352, 354 disclosed in FIGS. 6A-6B, each of the LC connectors 1202, 1204 may include a retaining latch configured to engage a corresponding slot in the ports 807, 809 and thereby secure the LC connectors 1202, 1204 within the ports 807, 809. Additionally, the connector removal mechanism 1206 may include a tab which can be depressed to disengage the retaining latches of the LC connectors 1202, 1204 from the corresponding slots in the ports 807, 809, allowing the duplex connector 850 to be removed from the transceiver module 850.

The fiber optic duplex connector 850 additionally includes embedded electrical traces 1208, 1210, 1212, and 1214. Each of the electrical traces 1208-1214 of the fiber optic connector 850 includes a contact 1216, 1218, 1220, and 1222, respectively, configured to be electrically coupled to a corresponding line-side contact 902a-902d of the OOB line-side electrical interface when the fiber optic connector 850 is inserted into the ports 807, 809 of the transceiver module 800. In this manner, the fiber optic connector 850 can electrically communicate with a microcontroller (or other component) on the PCB 830 of the transceiver 800.

In some embodiments, the fiber optic connector 850 can relay electrical data received from a microcontroller or other component on the PCB 830 via the OOB line-side electrical interface 900 to a network resource via a hardwired or wireless link coupled to the traces 1208-1214. Alternately or additionally, the fiber optic connector can relay electrical data from a network resource (via a hardwired or wireless link coupled to the traces 1208-1214) to a microcontroller or other component on the PCB 830 (via the OOB line side electrical interface 900). Alternately or additionally, a line-side device other than the fiber optic connector 850 having similarly arranged contacts 1216-1222 may be inserted into the ports 807, 809 of the transceiver 800 to electrically communicate via the OOB line-side electrical interface 900 with a microcontroller or other component on the PCB 830.

As disclosed herein, embodiments of the invention can implement conventional fiber optic connector geometry (e.g., LC connector geometry). The use of conventional connector geometry can enable backwards mechanical compatibility of the optoelectronic transceiver modules 300, 800 and/or fiber optic connector 350, 850 with conventional fiber optic connectors and/or optoelectronic transceiver modules. Additionally, the design of the contact arrangement of the connectors 350, 850 (and of the LC connectors 352, 354, and 1202, 1204 considered individually) can allow the connectors 350, 850 (and the LC connectors 352, 354 and 1202, 1204 individually) to be inserted into a standard SFP/SFP+ module without shorting electrically. Similarly, the design of the contact arrangement of the optoelectronic transceiver modules 300, 800 can allow the module 300, 800 to receive one or more standard fiber optic connectors without causing an electrical short.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An out-of-band line-side electrical interface configured to electrically connect a printed circuit board (PCB) of an optoelectronic device to an optical connector removably received within an optical port of the optoelectronic device, comprising:
    a lead frame body having a plurality of line-side posts and a plurality of PCB-side posts; and
    a plurality of traces embedded within the lead frame body, each of the traces including a line-side contact and a PCB-side contact, wherein each of the line-side contacts is embedded within a corresponding one of the line-side posts and is configured to be in direct contact with and electrically coupled to a corresponding contact on the optical connector when received within the optical port, and each of the PCB-side contacts is embedded within a corresponding one of the PCB-side posts and is configured to be in direct contact with and electrically coupled to a corresponding contact on the printed circuit board.

2. The out-of-band line-side electrical interface of claim 1, wherein the lead frame body comprises semi-rigid plastic.

3. The out-of-band line-side electrical interface of claim 1, wherein the lead frame body defines a first saddle for receiving the neck of a transmitter optical subassembly and a second saddle for receiving the neck of a receiver optical subassembly.

4. The out-of-band line-side electrical interface of claim 3, wherein the lead frame body further includes two posts surrounding the first saddle and second saddle and a post separating the first saddle from the second saddle, each of the surrounding posts and separating post defining a cavity configured to receive a corresponding insertion member of a positioning structure.

5. The out-of-band line-side electrical interface of claim 4, wherein the lead frame body, the positioning structure, and an end cap are configured to mechanically secure the printed circuit board, transmitter optical subassembly, and receiver optical subassembly within a shell of the optoelectronic device.

6. The out-of-band line-side electrical interface of claim 1, wherein the out-of-band line-side electrical interface is manufactured by over-molding the lead frame body on the plurality of traces.

7. The out-of-band line-side electrical interface of claim 1, wherein electrical coupling of the PCB-side contacts to the printed circuit board contacts is configured to be maintained during normal operation without soldering the PCB-side contacts to the printed circuit board contacts.

8. The out-of-band line-side electrical interface of claim 1, wherein:
    the optical connector includes a release latch base with two contacts, one contact each on opposite sides of the release latch base; and
    the release latch base is configured to be removably received between two of the plurality of line-side posts such that when received:
        a corresponding line-side contact of the two line-side posts is electrically coupled to a different one of the optical connector contacts; and
        each line-side post exerts a contact force on a corresponding optical connector contact, the two forces being equal in magnitude and opposite in direction.

9. The out-of-band line-side electrical interface of claim 1, wherein the plurality of traces are configured for one or more of the following:
    enabling electrical communication between a component on the printed circuit board and the optical connector, including one or more of:
        relaying digital diagnostic data from a microcontroller on the printed circuit board to the optical connector; and
        relaying programming commands, memory codes, or other information from the optical connector to the microcontroller; and
    providing electrical power to a light emitting diode or a motor through the optical connector.

10. An optoelectronic device configured to electrically communicate out-of-band through its front or line-side, comprising:
    a microcontroller electrically coupled to a printed circuit board (PCB);
    an optical port configured to removably receive an optical connector having a plurality of integrated contacts, the optical connector being configured to optically couple an optical transmitter or optical receiver of the optoelectronic device to an optical medium;
    a lead frame body having a plurality of line-side posts and a plurality of PCB-side posts; and
    a plurality of electrical connections from the printed circuit board to the optical port, the plurality of electrical connections configured to be electrically coupled to the plurality of integrated contacts of the optical connector when received within the optical port such that the microcontroller and optical connector can electrically communicate with each other through the printed circuit board and electrical connections, the plurality of electrical connections embedded within the lead frame body, each of the electrical connections including a line-side contact and a PCB-side contact, wherein each of the line-side contacts is embedded within a corresponding one of the line-side posts and is configured to be in direct contact with and electrically coupled to a corresponding one of the integrated contacts on the optical connector when received within the optical port, and each of the PCB-side contacts is embedded within a corresponding one of the PCB-side posts and is configured to be in direct contact with and electrically coupled to a corresponding contact on the printed circuit board.

11. The optoelectronic device of claim 10, further comprising an EMI shield separating the microcontroller from the optical port, wherein:
each electrical connection passes through a separate, minimized through hole in the EMI shield; or
the plurality of electrical connections are separated into one or more pairs, each pair passing through a separate, minimized through hole in the EMI shield.

12. The optoelectronic device of claim 10, wherein the electrical connections comprise a trace structure.

13. The optoelectronic device of claim 10, wherein the geometry of the optical port and the electrical connections enables the optical port to removably receive a standard optical connector lacking integrated contacts without causing an electrical short circuit between two or more of the electrical connections.

14. An optical connector configured to electrically communicate with an optoelectronic device through an out-of-band line-side electrical interface, comprising:
a release latch configured to engage a corresponding slot in an optical port of an optoelectronic device when the optical connector is removably received within the optical port;
a release latch base supporting the release latch; and
a plurality of electrical traces embedded in the optical connector, each electrical trace including a contact;
wherein the plurality of electrical contacts are configured to be in direct contact with and electrically coupled to corresponding contacts within the optical port when the optical connector is received within the optical port, the corresponding contacts within the optical port provide electrical connections to a microcontroller disposed on a printed circuit board (PCB) of the optoelectronic device, the electrical connections are embedded within a lead frame body having line-side posts and PCB-side posts, each of the electrical connections including a line-side contact and a PCB-side contact, each of the line-side contacts is embedded within a corresponding one of the line-side posts and is configured to be in direct contact with and electrically coupled to a corresponding one of the electrical contacts on the optical connector when received within the optical port, and each of the PCB-side contacts is embedded within a corresponding one of the PCB-side posts and is configured to be in direct contact with and electrically coupled to a corresponding contact on the printed circuit board.

15. The optical connector of claim 14, further comprising a wireless transmitter configured to wirelessly broadcast electrical data received from the microcontroller, or wirelessly receive electrical data intended for the microcontroller.

16. The optical connector of claim 14, wherein the geometry of the optical connector and embedded electrical traces enables the optical connector to be removably received within a standard optoelectronic device lacking contacts and electrical connections to a microcontroller without causing an electrical short circuit.

17. The optical connector of claim 14, wherein:
two of the plurality of contacts are positioned on opposite sides of the release latch base;
two of the corresponding contacts within the optical port are mechanically supported by a different line-side post; and
the release latch base is configured to be removably received between two of the line-side posts such that when received:
each of the two contacts of the optical connector is electrically coupled to a different one of the two contacts within the optical port; and
contact forces exerted by the two line-side posts on the two contacts of the optical connector are balanced.

* * * * *